(12) United States Patent
Ishimatsu

(10) Patent No.: US 11,070,202 B2
(45) Date of Patent: Jul. 20, 2021

(54) SIGNAL TRANSMISSION CIRCUIT, SWITCH DRIVING DEVICE, AND POWER MODULE

(71) Applicant: ROHM CO., LTD., Kyoto (JP)

(72) Inventor: Yuji Ishimatsu, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/965,943

(22) PCT Filed: Feb. 22, 2019

(86) PCT No.: PCT/JP2019/006733
§ 371 (c)(1),
(2) Date: Jul. 29, 2020

(87) PCT Pub. No.: WO2019/167827
PCT Pub. Date: Sep. 6, 2019

(65) Prior Publication Data
US 2021/0075418 A1 Mar. 11, 2021

(30) Foreign Application Priority Data

Mar. 1, 2018 (JP) .............................. JP2018-036646

(51) Int. Cl.
*H03K 17/284* (2006.01)
*H02M 1/08* (2006.01)
(Continued)

(52) U.S. Cl.
CPC ............ *H03K 17/284* (2013.01); *H02M 1/08* (2013.01); *H03K 17/16* (2013.01); *H03K 17/687* (2013.01);
(Continued)

(58) Field of Classification Search
CPC . G05F 1/00; G05F 1/565; H01L 27/00; H01L 27/0255; H02M 1/00; H02M 1/08;
(Continued)

(56) References Cited

U.S. PATENT DOCUMENTS

| | | | |
|---|---|---|---|
| 2005/0122138 A1* | 6/2005 | Chansungsan ... | G01R 19/16552 327/78 |
| 2012/0212270 A1* | 8/2012 | Ishimatsu ......... | H03K 17/0822 327/198 |
| 2018/0262186 A1* | 9/2018 | Sun ..................... | H03K 17/063 |

FOREIGN PATENT DOCUMENTS

| | | |
|---|---|---|
| JP | 2002314392 | 10/2002 |
| JP | 2007235245 | 9/2007 |

(Continued)

OTHER PUBLICATIONS

International Search Report and Written Opinion issued for International Patent Application No. PCT/JP2019/006733, dated May 14, 2019, 7 pages including English translation of Search Report.

*Primary Examiner* — Lincoln D Donovan
*Assistant Examiner* — Dave Mattison
(74) *Attorney, Agent, or Firm* — Hamre, Schumann, Mueller & Larson, P.C.

(57) ABSTRACT

A filter circuit includes a first rise delay circuit that delays a rising time of a first shifted signal by a predetermined time for output and a first fall delay circuit that delays a falling time of a second shifted signal by a predetermined time for output. The first rise delay circuit is configured so that a second rise delay signal does not follow a change in a first voltage toward a decreasing side and follows a change in the first voltage toward an increasing side. The first fall delay circuit is configured so that a second fall delay signal does not follow a change in the first voltage toward a decreasing side and follows a change in the first voltage toward an increasing side.

11 Claims, 14 Drawing Sheets

(51) Int. Cl.
    *H03K 17/16*         (2006.01)
    *H03K 17/687*      (2006.01)
    *H03K 19/003*      (2006.01)
    *H03K 19/0185*     (2006.01)
    *H02M 7/5387*      (2007.01)

(52) U.S. Cl.
    CPC ............ *H03K 19/00315* (2013.01); *H03K 19/018507* (2013.01); *H02M 7/5387* (2013.01)

(58) Field of Classification Search
    CPC .......... H02M 3/00; H02M 3/073; H02M 7/00; H02M 7/5387; H03K 17/00; H03K 17/16; H03K 17/28; H03K 17/284; H03K 17/687; H03K 19/00; H03K 19/00315; H03K 19/018507; H03K 3/00; H03K 3/027
    USPC ......................................................... 327/399
    See application file for complete search history.

(56)         References Cited

FOREIGN PATENT DOCUMENTS

| | | |
|---|---|---|
| JP | 2008278729 | 11/2008 |
| JP | 2009278406 | 11/2009 |
| JP | 2012175437 | 9/2012 |
| JP | 2013183422 | 9/2013 |
| JP | 2015033248 | 2/2015 |

\* cited by examiner

SIGNAL TRANSMISSION CIRCUIT, SWITCH DRIVING DEVICE, AND POWER MODULE

TECHNICAL FIELD

The present invention relates to a signal transmission circuit, a switch driving device, and a power module.

BACKGROUND ART

A switch driving circuit that controls a pair of switching elements controlling, for example, the supply of power to a coil of a motor includes an RS flip-flop circuit that outputs a signal to a switching element, a signal transmission circuit that outputs a level-shifted signal to a set terminal and a reset terminal of the RS flip-flop circuit, and a level shifter that level-shifts a pulse signal from a pulse generator and outputs the level-shifted signal to the signal transmission circuit (for example, refer to patent document 1).

PRIOR ART DOCUMENT

Patent Document

Patent Document 1: Japanese Laid-Open Patent Publication No. 2002-314392

SUMMARY OF THE INVENTION

Problems that the Invention is to Solve

In the conventional switch driving device, a change in the voltage applied to the switch driving device may cause the signal output from the signal transmission circuit to the RS flip-flop circuit to be an erroneous signal.

It is an object of the present invention to provide a signal transmission circuit, a switch driving device, and a power module switch device that reduce the output of an erroneous signal caused by a voltage change.

Means for Solving the Problem

A signal transmission circuit that achieves the above object includes a level shifter that is actuated with a first voltage and a second voltage, which is lower than the first voltage, and level-shifts each of a first input signal and a second input signal to output a first shifted signal and a second shifted signal and a filter circuit that is actuated with the first voltage and the second voltage and performs a filtering process on each of the first shifted signal and the second shifted signal. The filter circuit includes a first rise delay circuit that delays a rising time of the first shifted signal by a predetermined time for output and a first fall delay circuit that delays a falling time of the second shifted signal by a predetermined time for output. The first rise delay circuit includes a first rise delay NOT circuit that inverts the first shifted signal for output and a second rise delay NOT circuit that inverts a first rise delay signal of the first rise delay NOT circuit. The first fall delay circuit includes a first fall delay NOT circuit that inverts the second shifted signal for output and a second fall delay NOT circuit that inverts a first fall delay signal of the first fall delay NOT circuit for output. The first rise delay circuit is configured so that a second rise delay signal of the second rise delay NOT circuit does not follow a change in the first voltage toward a decreasing side and follows a change in the first voltage toward an increasing side. The first fall delay circuit is configured so that a second fall delay signal of the second fall delay NOT circuit does not follow a change in the first voltage toward a decreasing side and follows a change in the first voltage toward an increasing side.

With this configuration, when the first voltage changes so that the first voltage decreases and then increases so as to return to the first voltage prior to the decrease, the second rise delay signal and the second fall delay signal do not follow the first voltage when the first voltage decreases, and the second rise delay signal and the second fall delay follow the first voltage when the first voltage increases. This limits the output of erroneous signals as the output signal of the first rise delay circuit and the output signal of the first fall delay circuit. Accordingly, the output of an erroneous signal from the signal transmission circuit caused by a voltage change is limited.

The meaning of "the second rise delay signal does not follow a change in the first voltage toward a decreasing side" includes a state in which the second rise delay signal does not follow a change in the first voltage toward the decreasing side and a state in which the second rise delay signal is restricted from following a change in the first voltage toward the decreasing side. Further, the meaning of "the second fall delay signal does not follow a change in the first voltage toward a decreasing side" includes a state in which the second fall delay signal does not follow a change in the first voltage toward the decreasing side and a state in which the second fall delay signal is restricted from following a change in the first voltage toward the decreasing side.

Effects of the Invention

The present invention provides a signal transmission circuit, a switch driving device, and a power module switch device that reduce the output of an erroneous signal caused by a voltage change.

MODES FOR CARRYING OUT THE INVENTION

A signal transmission circuit, a switch driving device, and a power module will now be described with reference to the drawings. The embodiment described below exemplifies a configuration and method for embodying a technical concept and is not intended to limit the material, shape, structure, arrangement, dimensions, and the like of each component to the description. The embodiment described below may undergo various modifications.

In the present specification, "a state in which member A is connected to member B" includes a case in which member A and member B are directly connected physically and a case in which member A and member B are indirectly connected by another member that does not affect the electric connection state.

Similarly, "a state in which member C is arranged between member A and member B" includes a case in which member A is directly connected to member C or member B is directly connected to member C and a case in which member A is indirectly connected to member C by another member that does not affect the electric connection state or member B is indirectly connected to member C by another member that does not affect the electric connection state.

Figure 1:
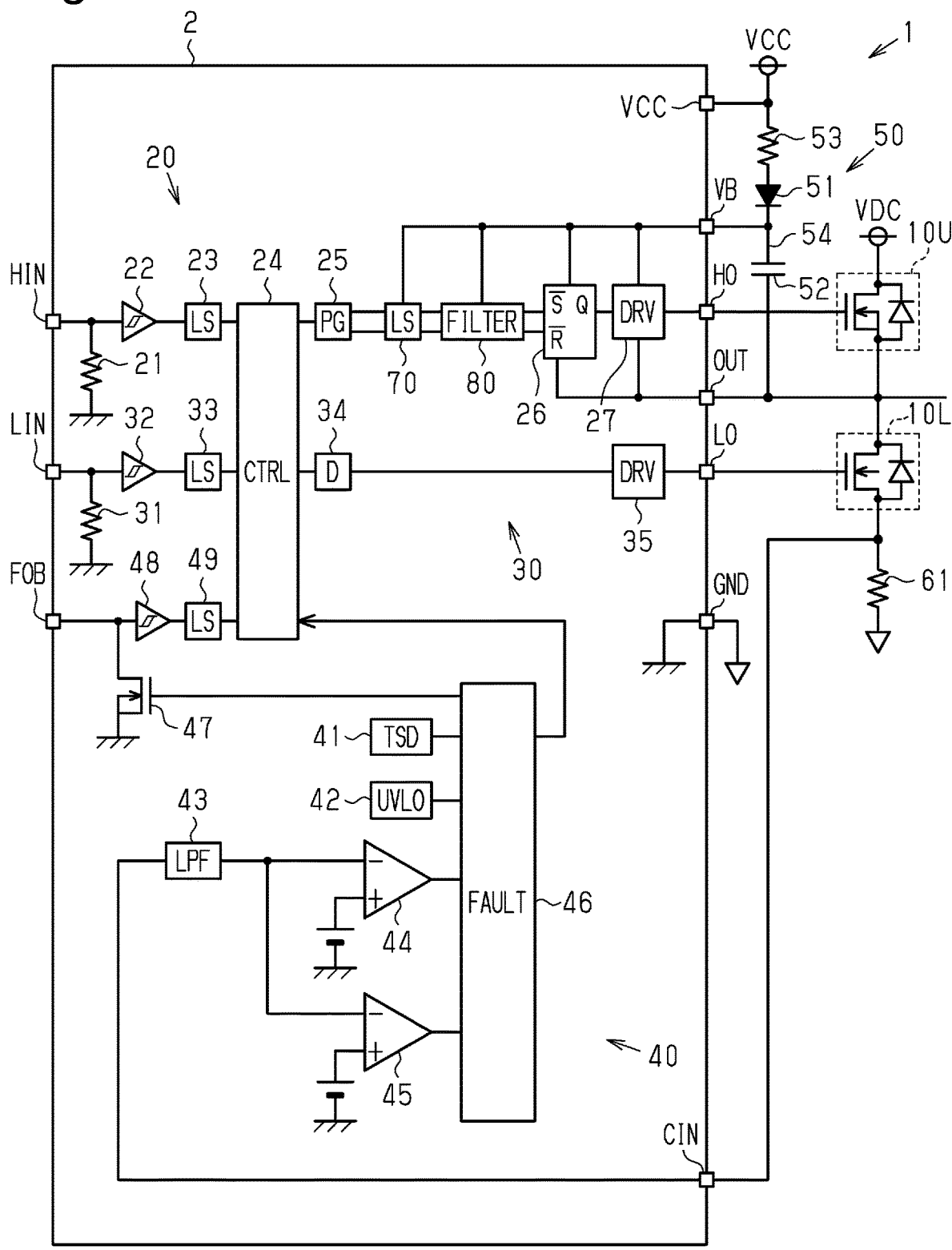
FIG. 1 is a block diagram showing the circuit configuration of a power module in accordance with a present embodiment.

As shown in FIG. 1, a power module 1 includes an upper switching element 10U and a lower switching element 10L, which are examples of switching elements, and a switch driving device 2, which drives the upper switching element 10U and the lower switching element 10L. In one example, with reference to FIG. 1, the switch driving device 2 is formed by a single chip and includes a VCC terminal (power terminal), an OUT terminal (output terminal), a GND terminal, a HO terminal, a LO terminal, a FOB terminal, a HIN terminal, a LIN terminal, a VB terminal, and a CIN terminal. The switch driving device 2 includes an upper switch driving unit 20, a lower switch driving unit 30, and a fault protection unit 40. The power module 1 includes a bootstrap circuit 50 and a current detection resistor 61. The bootstrap circuit 50 and the current detection resistor 61 are arranged outside the switch driving device 2. A first terminal of the current detection resistor 61 is electrically connected to the lower switching element 10L, and a second terminal of the current detection resistor 61 is connected to ground. The switch driving device 2 may be formed by a plurality of chips. In one example, the upper switch driving unit 20 and the lower switch driving unit 30 may be formed by separate chips. Further, part of the bootstrap circuit 50 may be arranged in the switch driving device 2. In one example, the bootstrap circuit 50 includes a boot diode 51 arranged in the switch driving device 2.

The upper switching element 10U and the lower switching element 10L use 4H—SiC (wide bandgap semiconductor having dielectric breakdown electric field of approximately 2.8 MV/cm and bandgap width of approximately 3.26 eV). The wideband gap semiconductor used for the upper switching element 10U and the lower switching element 10L is not limited to silicon carbide (SiC) and may be gallium nitride (GaN), gallium oxide ($Ga_2O_3$), diamond, or the like. Gallium nitride (GaN) has a dielectric breakdown electric field of approximately 3 MV/cm and a bandgap width of approximately 3.42 eV. Gallium oxide ($Ga_2O_3$) has a dielectric breakdown electric field of approximately 8 MV/cm and a bandgap width of approximately 4.8 eV. Diamond has a dielectric breakdown electric field of approximately 8 MV/cm and a bandgap width of approximately 5.47 eV. One example of each of the upper switching element 10U and the lower switching element 10L is a metal-oxide-semiconductor field-effect transistor (SiCMOS-FET). In the present embodiment, N-channel type SiC MSOFETs are used as the upper switching element 10U and the lower switching element 10L.

The upper switching element 10U and the lower switching element 10L are connected in series. In detail, the source of the upper switching element 10U is electrically connected to the drain of the lower switching element 10L. The drain of the upper switching element 10U is electrically connected to an application terminal of high voltage VDC (several hundred volts). The source of the lower switching element 10L is electrically connected to the first terminal of the current detection resistor 61. Further, the source of the lower switching element 10L is electrically connected via the CIN terminal to the fault protection unit 40. The gate of the upper switching element 10U is electrically connected via the HO terminal to the upper switch driving unit 20. The gate of the lower switching element 10L is electrically connected via the LO terminal to the lower switch driving unit 30.

The upper switch driving unit 20 is electrically connected to the HIN terminal. A gate signal voltage from an external gate driving circuit (not shown) is applied to the HIN terminal. The upper switch driving unit 20 is a circuit that applies the gate signal voltage to the gate of the upper switching element 10U. The lower switch driving unit 30 is electrically connected to the LIN terminal. A gate signal voltage from an external gate driving circuit (not shown) is applied to the LIN terminal. The lower switch driving unit 30 is a circuit that applies the gate signal voltage to the gate of the lower switching element 10L.

The upper switch driving unit 20 includes, in order from the input side (side of HIN terminal) toward the output side (side of HO terminal), a resistor 21, a Schmitt trigger 22, a level shifter 23, a controller 24, a pulse generator 25, a level shifter 70, a filter circuit 80, an RS flip-flop circuit 26, and a driver 27. In the upper switch driving unit 20, a configuration including at least the level shifter 70 and the filter circuit 80, is referred to as "the signal transmission circuit." In the present embodiment, the signal transmission circuit is a configuration including the level shifter 70, the filter circuit 80, and the RS flip-flop circuit 26.

The resistor 21 pulls down the HIN terminal to a ground terminal. Thus, when the HIN terminal is in an open state, an upper input signal HIN, which serves as the gate signal voltage from the gate driving circuit input to the HIN terminal, has a low level (logic level for turning off upper switching element 10U). Thus, the upper switching element 10U will not go on in an unintended manner.

The Schmitt trigger 22 transmits the upper input signal HIN, which is input to the HIN terminal, to the level shifter 23. The Schmitt trigger 22 has a threshold voltage provided with a predetermined hysteresis. Such a configuration increases noise immunity.

The level shifter 23 level-shifts the output signal of the Schmitt trigger 22 to a voltage level (VCC-GND) suited for input to the controller 24 and outputs the level-shifted signal.

The controller 24 determines whether to transmit the output signal of the level shifter 23 to the pulse generator 25 (consequently, whether to drive upper switching element 10U) based on a fault signal received from the fault protection unit 40 or an external fault signal received from the FOB terminal.

Based on the output signal of the controller 24, the pulse generator 25 generates the pulse signals of an on signal $S_{ON}$ (gate signal of transistor 71, described below, in level shifter 70), which is one example of a first input signal, and an off signal $S_{OFF}$ (gate signal of transistor 72, described below, in level shifter 70), which is one example of a second input signal. In detail, the pulse generator 25 uses the rising edge of the output signal of the controller 24 as a trigger for setting the on signal $S_{ON}$ to a high level during a predetermined on period Tom and uses the falling edge of the output signal of the controller 24 as a trigger for setting the off signal $S_{OFF}$ to a high level during a predetermined on period $T_{ON2}$. The output signal of the controller 24 (signal corresponding to upper input signal HIN), the on period $T_{ON1}$, and the on period $T_{ON2}$ are set so that the on signal $S_{ON}$ and the off signal $S_{OFF}$ both do not have a high level at the same time. That is, when the power module 1 is functioning normally, if at least one of the on signal $S_{ON}$ and the off signal $S_{OFF}$ has a high level, the other one of the on signal $S_{ON}$ and the off signal $S_{OFF}$ has a low level.

The level shifter 70 is a circuit that shifts a signal level and transmits the level-shifted signal between a high potential block and a low potential block. The high potential block includes the filter circuit 80, the RS flip-flop circuit 26, and the driver 27. The low potential block includes the pulse generator 25. In detail, the level shifter 70 receives the on signal $S_{ON}$, which is one example of the first input signal, and the off signal $S_{OFF}$, which is one example of the second input signal, from the pulse generator 25 that belongs to the low potential block. The level shifter 70 level-shifts and outputs these signals as a first shifted signal and a second shifted signal to the filter circuit 80. The high potential block is actuated with a boost voltage VB, which is one example of a first voltage applied to the VB terminal, and a switch voltage VS, which is one example of a second voltage applied to the OUT terminal.

The filter circuit 80 is a circuit that performs a filtering process on the first shifted signal and the second shifted signal received from the level shifter 70 and outputs the filtered signal to the RS flip-flop circuit 26.

The RS flip-flop circuit 26 includes a set terminal (S terminal) that receives the first shifted signal, which has been filtered by the filter circuit 80, as a set signal $S_{SET}$, a reset terminal (R terminal) that receives the second shifted signal, which has been filtered by the filter circuit 80, as a reset signal $S_{RESET}$, and an output terminal (Q terminal) that outputs an output signal $S_Q$. The RS flip-flop circuit 26 uses the falling edge of the set signal $S_{SET}$ as a trigger to set the output signal $S_Q$ to a high level and uses the falling edge of the reset signal $S_{RESET}$ as a trigger to set the output signal $S_Q$ to a low level.

Figure 2:
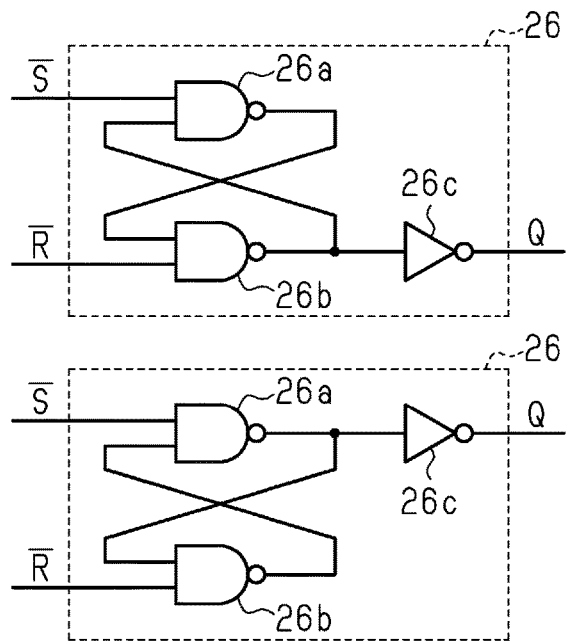
FIG. 2 is a detailed diagram of an RS flip-flop circuit.

The set signal $S_{SET}$ and the reset signal $S_{RESET}$ are both received from the level shifter 70. Further, as shown in FIG. 2, the RS flip-flop circuit 26 includes two NAND circuits 26a and 26b and a NOT circuit 26c. The RS flip-flop circuit 26 may be configured as a reset-dominant type as shown in the upper section of FIG. 2 or a set-dominant type as shown in the lower section of FIG. 2.

As shown in FIG. 1, the driver 27 generates an upper output signal HO, which is a signal corresponding to the output signal of the RS flip-flop circuit 26, and outputs the upper output signal HO to the gate of the upper switching element 10U. The upper output signal HO becomes the boost voltage VB when having a high level and the switch voltage VS when having a low level.

The lower switch driving unit 30 includes, in order from the input side (side of LIN terminal) toward the output side (side of LO terminal), a resistor 31, a Schmitt trigger 32, a level shifter 33, a delay circuit 34, and a driver 35. In the present embodiment, the controller 24 of the upper switch driving unit 20 is arranged between the level shifter 33 and the delay circuit 34. The lower switch driving unit 30 may include a controller that is separate from the controller 24 of the upper switch driving unit 20. In this case, the controller of the lower switch driving unit 30 may be arranged between the delay circuit 34 and the driver 35. This will allow the controller to readily turn off the lower switching element 10L when a fault occurs because signals will not have to be sent through the delay circuit 34.

The resistor 31 pulls down the LIN terminal to a ground terminal. Thus, when the LIN terminal is in an open state, a lower input signal LIN, which serves as the gate signal voltage from the gate driving circuit, has a low level (logic level for turning off lower switching element 10L). Thus, the lower switching element 10L will not go on in an unintended manner.

The Schmitt trigger 32 transmits the lower input signal LIN, which is input to the LIN terminal, to the level shifter 33. The Schmitt trigger 32 has a threshold voltage provided with a predetermined hysteresis. Such a configuration increases noise immunity.

The level shifter 33 level-shifts the output signal of the Schmitt trigger 32 to a voltage level (VCC-GND) suited for input to the controller 24 and outputs the level-shifted signal.

The controller 24 determines whether to set the output signal of the delay circuit 34 as the voltage of the driver 35 (consequently, whether to drive the lower switching element 10L) based on a fault signal received from the fault protection unit 40 or an external fault signal received from the FOB terminal.

The delay circuit 34 adds a predetermined delay (corresponding to circuit delay that occurs in pulse generator 25, level shifter 70, and RS flip-flop circuit 26 of upper switch driving unit 20) to the output signal of the controller 24 and transmits the delayed output signal to the driver 35.

The driver 35 outputs a lower output signal LO to the gate of the lower switching element 10L based on the output signal of the controller 24 delayed by the delay circuit 34. The lower output signal LO becomes a power voltage VCC when having a high level and a ground voltage VGND when having a low level.

The fault protection unit 40 includes a temperature protection circuit 41 (thermal shutdown (TSD) circuit), a reduced voltage protection circuit 42, a low-pass filter circuit 43, a current limiting circuit 44, a short-circuit protection circuit 45, a fault signal generation circuit 46, a transistor 47, a Schmitt trigger 48, and a level shifter 49.

When a junction temperature of the power module 1 becomes higher than a predetermined threshold temperature, the temperature protection circuit 41 switches a temperature protection signal from a logic level for a normal state (e.g., low level) to a logic level for a faulty state (e.g., high level).

When the power voltage VCC becomes lower than a predetermined threshold voltage, the reduced voltage protection circuit 42 switches a reduced voltage protection signal from a logic level for a normal state (e.g., low level) to a logic level for a faulty state (e.g., high level).

The low-pass filter circuit 43 is electrically connected to a detection terminal CIN. The low-pass filter circuit 43 outputs a detection voltage CIN to each of the current limiting circuit 44 and the short-circuit protection circuit 45.

When the detection voltage CIN becomes higher than a first threshold value, the current limiting circuit 44 switches a current limiting signal from a logic level for a normal state (e.g., low level) to a logic level for a faulty state (e.g., high level).

When the detection voltage CIN becomes higher than a second threshold value, the short-circuit protection circuit 45 switches a short-circuit protection signal from a logic level for a normal state (e.g., low level) to a logic level for a faulty state (e.g., high level). One example of the second threshold value is a voltage value that is higher than the first threshold value.

The fault signal generation circuit 46 monitors each of the temperature protection signal received from the temperature protection circuit 41, the reduced voltage protection signal received from the reduced voltage protection circuit 42, the current limiting signal received from the current limiting circuit 44, the short-circuit protection signal received from the short-circuit protection circuit 45, and the external fault signal received from the FOB terminal. When a fault occurs in the current limiting circuit 44, the fault signal generation circuit 46 switches a first fault signal from a logic level for a normal state (e.g., low level) to a logic level for a faulty state (e.g., high level). When a fault occurs in any one of the temperature protection circuit 41, the reduced voltage protection circuit 42, and the short-circuit protection circuit 45 or when an external fault signal is received, the fault signal generation circuit 46 switches a second fault signal from a logic level for a normal state (e.g., low level) to a logic level for a faulty state (e.g., high level). The fault signal generation circuit 46 outputs the first fault signal and the second fault signal to the controller 24.

When receiving the first fault signal, the controller 24 limits the current flowing through, for example, one of the upper switching element 10U and the lower switching element 10L. When receiving the second fault signal, the controller 24 turns off both of the upper switching element 10U and the lower switching element 10L. The fault signal generation circuit 46 switches the logic level of the first fault signal to the logic level for a fault when receiving the current limiting signal and switches the second fault signal to the logic level for a fault when receiving the temperature protection signal, the reduced voltage protection signal, the short-circuit protection signal, and the external fault signal.

The transistor 47 forms an open drain output stage to output an external fault signal from the FOB terminal. When a fault is not occurring in the power module 1, the fault signal generation circuit 46 turns off the transistor 47 and sets the external fault signal to a high level. When a fault is occurring in the power module 1, the fault signal generation circuit 46 turns on the transistor 47 and sets the external fault signal to a low level.

The Schmitt trigger 48 transmits the external fault signal, which is input to the FOB terminal (e.g., external fault signal output from FOB terminal of another power module 1), to the level shifter 49. The Schmitt trigger 48 has a threshold voltage provided with a predetermined hysteresis. Such a configuration increases noise immunity.

The level shifter 49 level-shifts the output signal of the Schmitt trigger 48 to a voltage level (VCC-GND) suited for input to the controller 24 and outputs the level-shifted signal.

The bootstrap circuit 50 includes a boot diode 51, of which the anode is connected via a resistor 53 to the application terminal of the power voltage VCC, and a boot capacitor 52, which is arranged between the cathode of the boot diode 51 and the source of the upper switching element 10U. The boot capacitor 52 is electrically connected to the VB terminal and the OUT terminal.

The bootstrap circuit 50 generates the boost voltage VB (driving voltage of high potential block including driver 27 and the like) at a connection node of (VB terminal) of the boot diode 51 and the boot capacitor 52. The resistor 53 limits the current supplied from an external power supply via the VCC terminal to the boot diode 51. This limits the charging current of the boot capacitor 52.

By turning off the upper switching element 10U and turning on the lower switching element 10L, when the switch voltage VS at the OUT terminal has a low level (GND), current flows through a path extending from the application terminal of the power voltage VCC through the boot diode 51, the boot capacitor 52, and the lower switching element 10L. This charges the boot capacitor 52 arranged between the VB terminal and the OUT terminal. In this case, the boost voltage VB (i.e., charging voltage of boot capacitor 52) at the VB terminal is a voltage value (VCC-Vf) obtained by subtracting a forward voltage drop Vf of the boot diode 51 from the power voltage VCC.

In a state in which the boot capacitor 52 is being charged, the upper switching element 10U is turned on and the lower switching element 10L is turned on so that the switch voltage VS rises from a low level (GND) to a high level (HV). The boost voltage VB is further increased from the switch voltage VS of the high level (HV) by the charging voltage of the boot capacitor 52 (VCC-Vf) to a higher voltage value (HV+VCC-Vf). Accordingly, the use of the boost voltage VB as the driving voltage for the high potential block (RS flip-flop circuit 26 and driver 27) and the level shifter 70 allows for the execution of on-off control (in particular, on control), which is the switching action of the upper switching element 10U.

Figure 3:
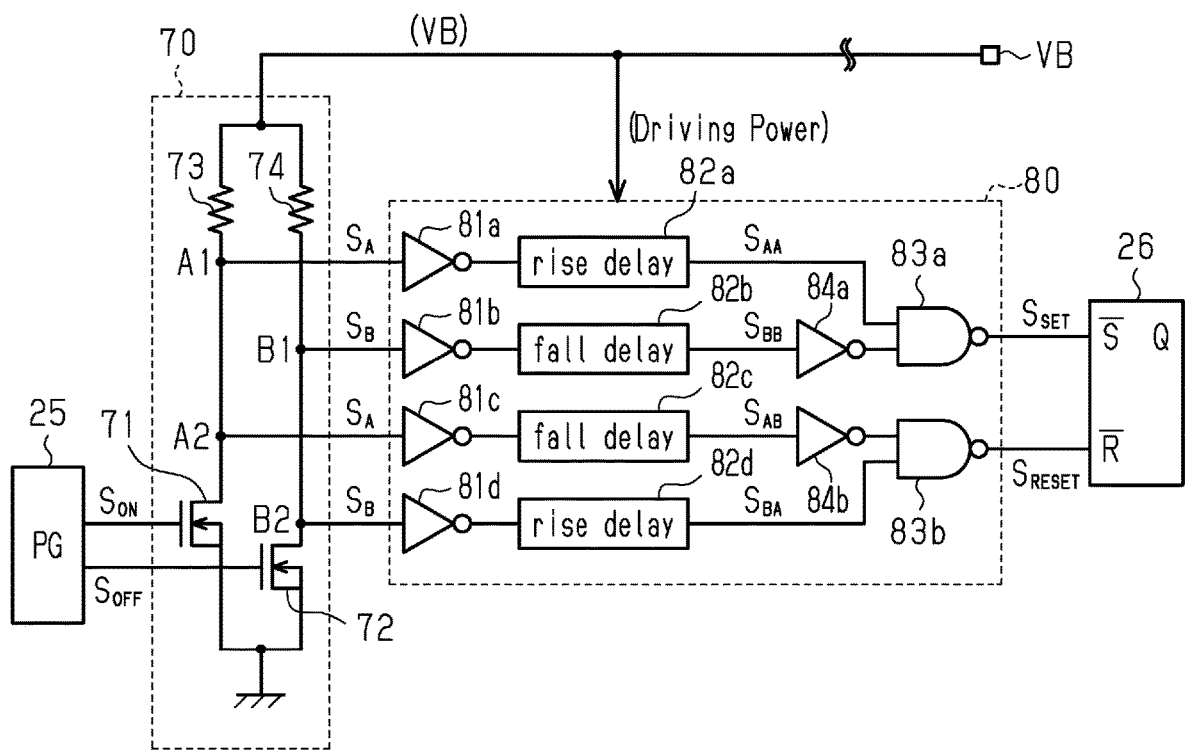
FIG. 3 is a diagram of a level shifter and a filter circuit.

The configuration of the level shifter 70 and the filter circuit 80 will now be described with reference to FIG. 3.

The level shifter 70 includes the transistor 71, the transistor 72, a resistor 73, and a resistor 74. Each of the transistors 71 and 72 is an N-type double-diffused MOSFET (DMOSFET).

The source and back gate of each of the transistors 71 and 72 are both connected to a ground terminal GND. The drain of the transistor 71 is connected to two input terminals (NOT circuit 81a and NOT circuit 81c) of the filter circuit 80 and also connected via the resistor 73 to the VB terminal. The drain of the transistor 72 is connected to two input terminals (NOT circuit 81b and NOT circuit 81d) of the filter circuit 80 and also connected via the resistor 74 to the VB terminal. The transistors 71 and 72 are designed to have a higher withstand voltage (e.g., 600 V withstand voltage) than the transistors of the low potential block.

The gate of the transistor 71 receives the on signal $S_{ON}$ from the pulse generator 25. Further, the gate of the transistor 72 receives the off signal $S_{OFF}$ from the pulse generator 25.

In this manner, the level shifter 70 includes a first series circuit that connects the transistor 71, which is turned on and off in accordance with the on signal $S_{ON}$, and the resistor 73 in series and a second series circuit that connects the transistor 72, which is turned on and off in accordance with the off signal $S_{OFF}$, and the resistor 74 in series. The first series circuit and the second series circuit are arranged in parallel between the VB terminal (may be recognized as power supply of boost voltage VB) and the ground terminal GND.

The level shifter 70 outputs the voltage at the side of the first series circuit that is closer to the ground terminal GND than the resistor 73 (point A1 and point A2 shown in FIG. 3) as a signal $S_A$ (first shifted signal), which is generated by level-shifting the on signal $S_{ON}$, to the filter circuit 80 (NOT circuit 81a and NOT circuit 81c). Further, the level shifter 70 outputs the voltage at the side of the second series circuit that is closer to the ground terminal GND than the resistor 74 (point B1 and point B2 shown in FIG. 3) as a signal $S_B$ (second shifted signal), which is generated by level-shifting the off signal $S_{OFF}$, to the filter circuit 80 (NOT circuit 81b and NOT circuit 81d). Point A1 may be the same as point A2, and point B1 may be the same as point B2.

The filter circuit 80 includes the NOT circuits 81a to 81d, a first rise delay circuit 82a, a first fall delay circuit 82b, a second fall delay circuit 82c, a second rise delay circuit 82d, a NAND circuit 83a, which is one example of a first logic circuit, a NAND circuit 83b, which is one example of a second logic circuit, and NOT circuits 84a and 84b.

The NOT circuit 81a receives the signal $S_A$, which is the first shifted signal, from the level shifter 70. The NOT circuit 81b receives the signal $S_B$, which is the second shifted signal, from the level shifter 70. the NOT circuit 81c receives the signal $S_A$, which is the first shifted signal, from the level shifter 70. The NOT circuit 81d receives the signal $S_B$, which is the second shifted signal, from the level shifter 70. Further, the output terminal of the NOT circuit 81a is connected via the first rise delay circuit 82a to one input terminal of the NAND circuit 83a, and the output terminal of the NOT circuit 81b is connected via the first fall delay circuit 82b and the NOT circuit 84a, in this order, to the other input terminal of the NAND circuit 83a. Further, the output terminal of the NOT circuit 81c is connected via the second fall delay circuit 82c and the NOT circuit 84b, in this order, to one input terminal of the NAND circuit 83b, and the output terminal of the NOT circuit 81d is connected via the second rise delay circuit 82d to the other input terminal of the NAND circuit 83b.

The NAND circuit 83a generates an output signal from the output signal of the first rise delay circuit 82a and the output signal of the NOT circuit 84a. The output signal of the NAND circuit 83a is output as the set signal $S_{SET}$ for the RS flip-flop circuit 26 to the set terminal (S terminal) of the RS flip-flop circuit 26. Further, the NAND circuit 83b generates an output signal from the second rise delay circuit 82d and the output signal of the NOT circuit 84b. The output signal of the NAND circuit 83b is output as the reset signal $S_{RESET}$ for the RS flip-flop circuit 26 to the reset terminal (R terminal) of the RS flip-flop circuit 26.

The first rise delay circuit 82a performs a rise delay process for delaying the rising time of a pulse signal received from a preceding stage (first shifted signal) by a time that is set in advance (predetermined time) to output a signal $S_{AA}$ to a following stage. The first fall delay circuit 82b performs a fall delay process for delaying the falling time of a pulse signal received from a preceding stage (first shifted signal) by a time that is set in advance (predetermined time) to output a signal $S_{BB}$ to a following stage. The signal $S_{AA}$ is used as a main signal for the set side of the RS flip-flop circuit 26, and the signal $S_{BB}$ is used as a mask signal (signal for masking erroneous pulse) for the set side.

The "rise delay process" is one example of a process performed on a pulse signal, which is the processing subject, to delay the starting time of each pulse (pulse start delay process). The delay in the starting time decreases the width of the corresponding pulse accordingly. The "fall delay process" is one example of a process performed on a pulse signal, which is the processing subject, to delay the ending time of each pulse (pulse end delay process). The delay in the ending time increases the width of the corresponding pulse accordingly.

The second fall delay circuit 82c performs a fall delay process for delaying the falling time of a pulse signal received from a preceding stage by a time that is set in advance (predetermined time) to output a signal $S_{AB}$ to a following stage. The second rise delay circuit 82d performs a rise delay process for delaying the rising time of a pulse signal received from a preceding stage by a time that is set in advance (predetermined time) to output a signal $S_{BA}$ to a following stage. The signal $S_{AB}$ is used as a main signal for a reset side of the RS flip-flop circuit 26, and the signal $S_{BA}$ is used as a mask signal for the reset side.

The NOT circuit 84a receives the signal $S_{BB}$, which is the mask signal for the set side from the first fall delay circuit 82C. The NOT circuit 84b receives the signal $S_{AB}$, which is the main signal for the set side from the second fall delay circuit 82d. Further, the output terminal of the NOT circuit 84a is connected to the other input terminal of the NAND circuit 83a, and the output terminal of the NOT circuit 84b is connected to the one terminal of the NAND circuit 83b.

The filter circuit 80 described above performs a filtering process on the pulses of the signal $S_A$ and the signal $S_B$ received from the level shifter 70 in which the process considers pulses substantially overlapping each other over time as erroneous pulses and cancels such erroneous pulses.

Figure 4:
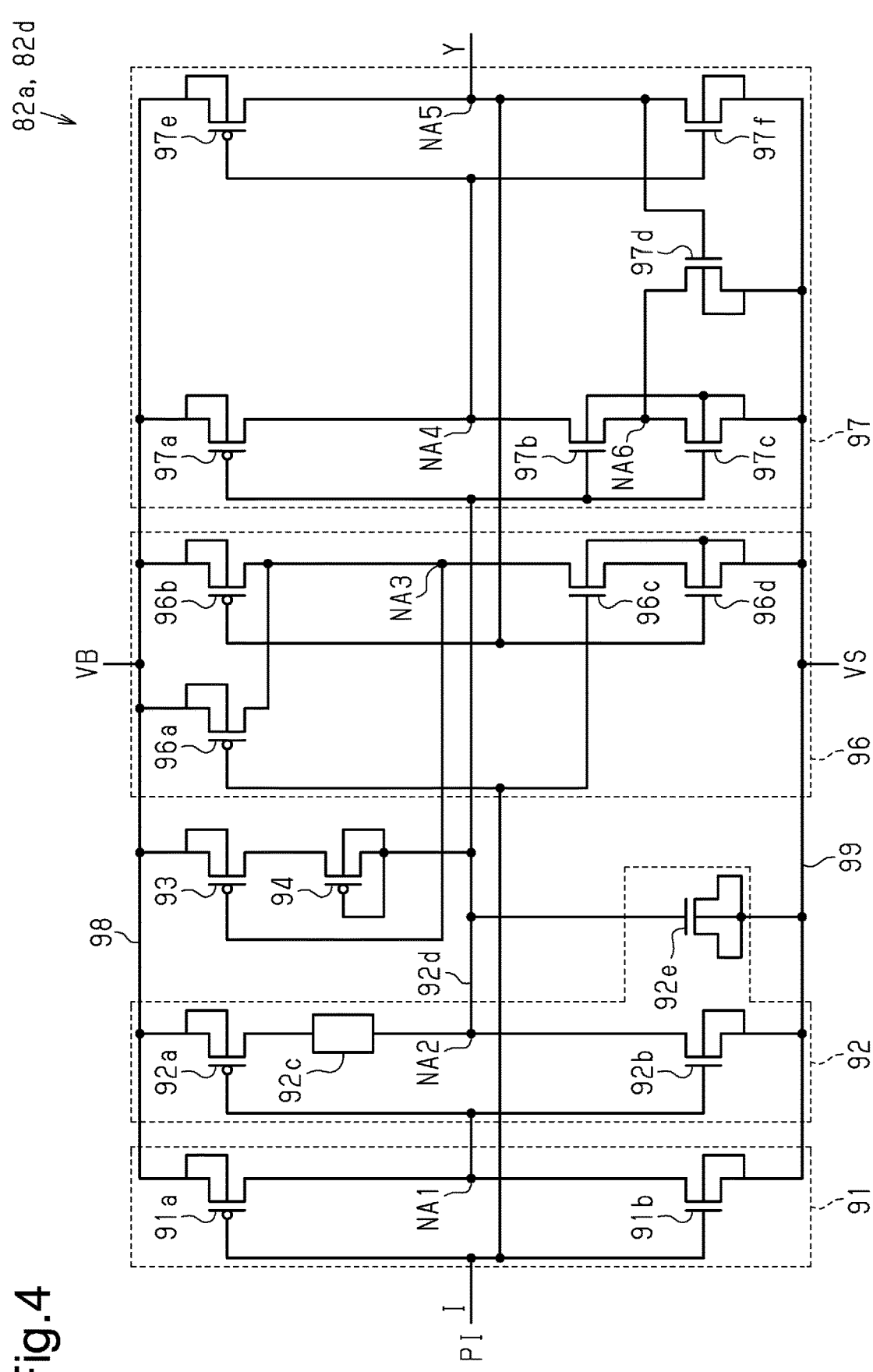
FIG. 4 is a circuit diagram of a rise delay circuit in the filter circuit.

FIG. 4 shows the circuit configuration of the first rise delay circuit 82a in detail. The circuit configuration of the second rise delay circuit 82d is identical to the circuit configuration of FIG. 4.

The first rise delay circuit 82a includes a NOT circuit 91, which is one example of a first rise delay NOT circuit, a NOT circuit 92, which is one example of a second rise delay NOT circuit, a transistor 93, which is one example of a switch, a first diode 94, a NAND circuit 96, and a Schmitt trigger 97. The first rise delay circuit 82a receives an input signal I, which serves as a pulse signal, from the preceding stage. The first rise delay circuit 82a outputs an output signal Y. The NOT circuit 91, the NOT circuit 92, the transistor 93, the first diode 94, the NAND circuit 96, and the Schmitt trigger 97 are each arranged between a first power line 98, to which the boost voltage VB is applied via the VB terminal, and a second power line 99, to which the switch voltage VS is applied via the VS terminal. The NOT circuit 91, the NOT circuit 92, the NAND circuit 96, and the Schmitt trigger 97 are connected in parallel to one another between the first power line 98 and the second power line 99. In this manner, the first power line 98 applies the boost voltage VB to the first rise delay circuit 82a.

The NOT circuit 91 inverts the first shifted signal and outputs the inverted signal as a first rise delay signal to the NOT circuit 92. The NOT circuit 91 includes a transistor 91a and a transistor 91b. The transistor 91a and the transistor 91b are connected to each other in series. One example of the transistor 91a is a P-channel MOSFET, and one example of the transistor 91b is an N-channel MOSFET. The source of the transistor 91a is connected to the first power line 98, the drain of the transistor 91a is connected to the drain of the transistor 91b, and the back gate of the transistor 91a is connected to the source of the transistor 91a. The source of the transistor 91b is connected to the second power line 99, and the back gate of the transistor 91b is connected to the source of the transistor 91b. The gate of the transistor 91a and the gate of the transistor 91b, which are connected to each other, are connected to an input terminal PI, which receives the input signal I.

The NOT circuit 92 inverts the first rise delay signal from the NOT circuit 91 and outputs the inverted signal as a second rise delay signal to the Schmitt trigger 97. The NOT circuit 92 includes a transistor 92a, a transistor 92b, a first resistor 92c, and a transistor 92e. The NOT circuit 92 outputs the second rise delay signal through a first intermediate line 92d to the Schmitt trigger 97. The transistor 92a and the transistor 92b are connected to each other in series. The first resistor 92c is arranged between the transistor 92a and the transistor 92b. One example of the transistor 92a is a P-channel MOSFET, and one example of the transistor 92b is an N-channel MOSFET. The source of the transistor 92a is connected to the first power line 98, the drain of the transistor 92a is connected via the first resistor 92c to the drain of the transistor 92b, and the back gate of the transistor 92a is connected to the source of the transistor 92a. The source of the transistor 92b is connected to the second power line 99, and the back gate of the transistor 92b is connected to the source of the transistor 92b. The gate of the transistor 92a and the gate of the transistor 92b, which are connected to each other, are connected to a node NA1 between the drain of the transistor 91a and the drain of the transistor 91b in the NOT circuit 91. The first intermediate line 92d is connected to a node NA2 between the first resistor 92c and the drain of the transistor 92b. The transistor 92e is arranged between the first intermediate line 92d and the second power line 99. The transistor 92e is an N-channel MOSFET. The transistor 92e has a gate connected to the first intermediate line 92d and a drain and source connected to the second power line 99 to function as a MOS capacitor. In the description hereafter, the transistor 92e may be referred to as "the first capacitor 92e."

The Schmitt trigger 97 includes six transistors 97a to 97f. The transistors 97a and 97e are P-channel MOSFETs, and the transistors 97b to 97d and 97f are N-channel MOSFETs. The first intermediate line 92d is connected to the gates of the transistors 97a, 97b, and 97c. The source of the transistor 97a is connected to the first power line 98, the drain of the transistor 97a is connected to the drain of the transistor 97b, the source of the transistor 97b is connected to the drain of the transistor 97c, and the source of the transistor 97c is connected to the second power line 99. The back gate of the transistor 97a is connected to the source of the transistor 97a. The back gates of the transistors 97b and 97c are connected to the source of the transistor 97c. The drain of the transistor 97d is connected to a node NA6, which is connected to the source of the transistor 97b and the drain of the transistor 97c. The source of the transistor 97d is connected to the second power line 99.

The drain of the transistor 97a and the drain of the transistor 97b are connected to a node NA4, which is connected to the gate of the transistor 97e and the gate of the transistor 97f. The source of the transistor 97e is connected to the first power line 98, the drain of the transistor 97e is connected to the drain of the transistor 97f, and the back gate of the transistor 97e is connected to the source of the transistor 97e. The source of the transistor 97f is connected to the second power line 99, and the back gate of the transistor 97f is connected to the source of the transistor 97f. The drain of the transistor 97e and the drain of the transistor 97f are connected to a node NA5, which is connected to the gate of the transistor 97d.

Two threshold values are set for the Schmitt trigger 97 based on the on resistance of each of the transistors 97a, 97b, 97c, and 97d. The on resistance of each of the transistors 97a, 97b, 97c, and 97d is determined by setting a suitable channel length and channel width for each of the transistors 97a, 97b, 97c, and 97d.

The transistor 93 and the transistor 94 are arranged between the first power line 98 and the first intermediate line 92d. The transistor 93 and the transistor 94 are connected to each other in series. One example of the transistor 93 is a P-channel MOSFET. One example of the transistor 94 is a P-channel MOSFET. The source of the transistor 93 is connected to the first power line 98, the drain of the transistor 93 is connected to the source of the transistor 94, and the back gate of the transistor 93 is connected to the source of the transistor 93. The source of the transistor 94 is connected to the first intermediate line 92d, and the gate and back gate of the transistor 94 are connected to the source of the transistor 94. The transistor 94, which is diode-connected, functions as a diode including an anode connected to the transistor 93 and a cathode connected to the first intermediate line 92d. In the description hereafter, the transistor 94 may be referred to as "the first diode 94."

The NAND circuit 96 includes four transistors 96a to 96d. The two transistors 96a and 96b, which are connected to the first power line 98, are P-channel MOSFETs and connected to each other in parallel. The transistor 96c and the transistor 96d are N-channel MOSFETs and connected to each other in series. The input signal I is provided to the gates of the transistors 96a and 96c, and the output signal Y is provided to the gates of the transistors 96b and 96d. The sources of the transistors 96a and 96b are connected to the first power line 98, and the drains of the transistors 96a and 96b are connected to the drain of the transistor 96c. The back gate of the transistor 96a is connected to the source of the transistor 96a. The back gate of the transistor 96b is connected to the source of the transistor 96b. The source of the transistor 96c is connected to the drain of the transistor 96d, and the source of the transistor 96d is connected to the second power line 99. The back gates of the transistors 96c and 96d are connected to the source of the transistor 96d. A node NA3 between the drains of the transistors 96a and 96b and the drain of the transistor 96c is connected to the gate of the transistor 93.

The NAND circuit 96 actuates the transistor 93 in accordance with the input signal I and the output signal Y. In detail, the NAND circuit 96 turns on the transistor 93 when both of the input signal I and the output signal Y have a high level and turns off the transistor 93 when one of the input signal I and the output signal Y has a low level. In other words, the NAND circuit 96 turns on the transistor 93 during a period from when the output signal Y shifts to a high level to when the input signal I shifts to a low level.

Figure 5:
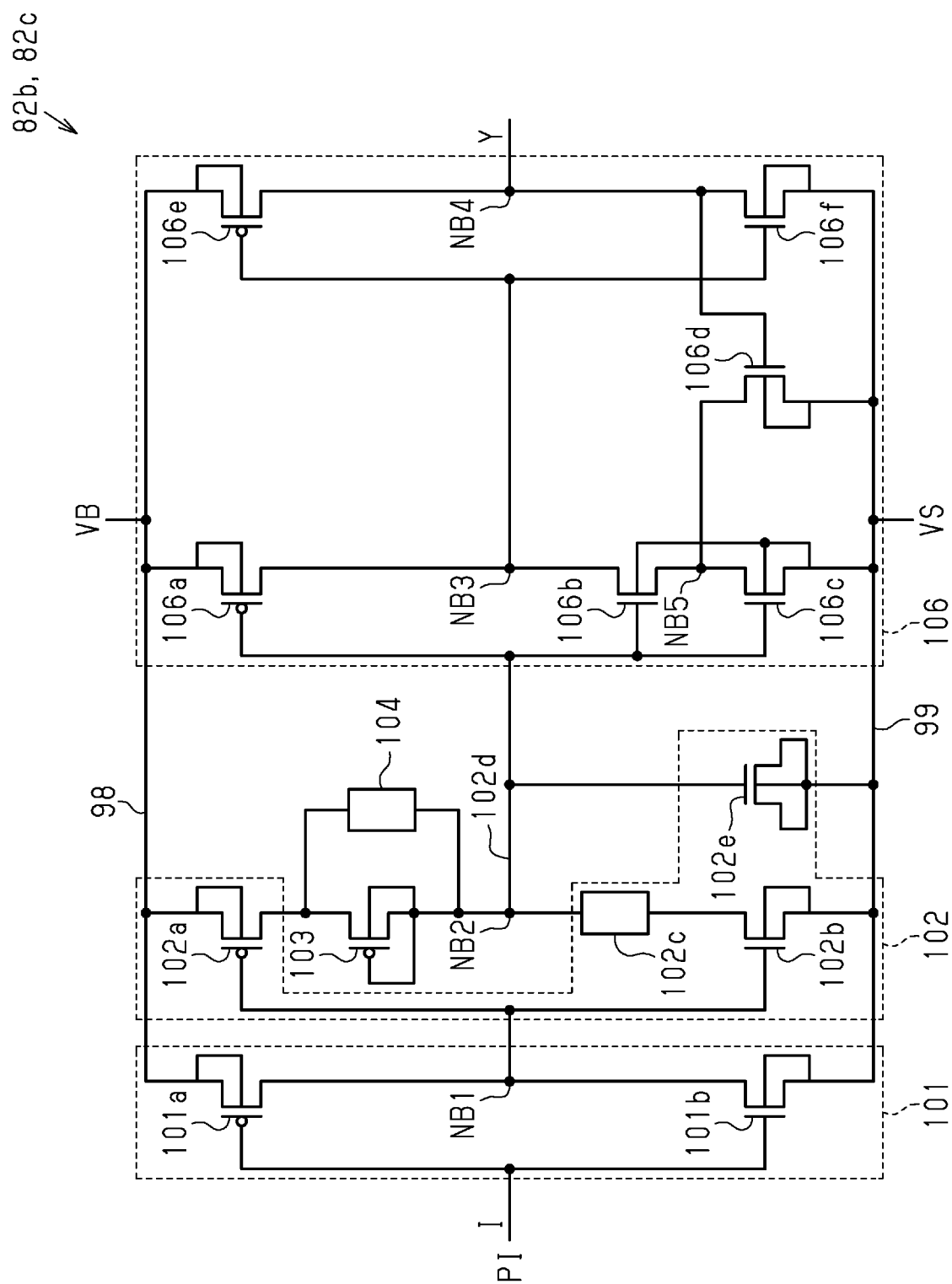
FIG. 5 is a circuit diagram of a fall delay circuit in the filter circuit.

FIG. 5 shows the circuit configuration of the first fall delay circuit 82b in detail. The circuit configuration of the second fall delay circuit 82c is identical to the circuit configuration of FIG. 5.

The first fall delay circuit 82b includes a NOT circuit 101, which is one example of a first fall delay NOT circuit, a NOT circuit 102, which is one example of a second fall delay NOT circuit, a second diode 103, a discharge resistor 104, and a Schmitt trigger 106. The NOT circuit 101, the NOT circuit 102, and the Schmitt trigger 106 are connected in parallel to one another between the first power line 98 and the second power line 99. In this manner, the first power line 98 applies the boost voltage VB to the first fall delay circuit 82b.

The NOT circuit 101 inverts the second shifted signal and outputs the inverted signal as a first fall delay signal to the NOT circuit 102. The NOT circuit 101 includes a transistor 101a and a transistor 101b. One example of the transistor 101a is a P-channel MOSFET, and one example of the transistor 101b is an N-channel MOSFET. The source of the transistor 101a is connected to the first power line 98, the drain of the transistor 101a is connected to the drain of the transistor 101b, the gate of the transistor 101a is connected to the gate of the transistor 101b, and the back gate of the transistor 101a is connected to the source of the transistor 101a. The source of the transistor 101b is connected to the second power line 99, and the back gate of the transistor 101b is connected to the source of the transistor 101b.

The NOT circuit 102 inverts the first fall delay signal and outputs the inverted signal as a second fall delay signal to the Schmitt trigger 106. The NOT circuit 102 includes a transistor 102a, a transistor 102b, a second resistor 102c, and a transistor 102e. One example of the transistor 102a is a P-channel MOSFET, and one example of the transistor 102b is an N-channel MOSFET. The source of the transistor 102a is connected to the first power line 98, the drain of the transistor 102a is connected to the drain of the transistor 102b, the gate of the transistor 102a is connected to the gate of the transistor 102b, and the back gate of the transistor 102a is connected to the source of the transistor 102a. The source of the transistor 102b is connected to the second power line 99, and the back gate of the transistor 102b is connected to the source of the transistor 102b. The gate of the transistor 102a and the gate of the transistor 102b are connected to a node NB1, which is connected to the drain of the transistor 101a and the drain of the transistor 101b in the NOT circuit 101. The second resistor 102c is arranged between the transistor 102a and the transistor 102b. The transistor 102e is arranged between a second intermediate line 102d and the second power line 99. The transistor 102e is an N-channel MOSFET. The transistor 102e has a gate connected to the second intermediate line 102d and a drain and source connected to the second power line 99 to function as a MOS capacitor. In the description hereafter, the transistor 102e may be referred to as "the second capacitor 102e."

The transistor 103 and the discharge resistor 104 are arranged between the transistor 102a and the transistor 102b of the NOT circuit 102. In further detail, the transistor 103 and the discharge resistor 104 are arranged between the transistor 102a and the second resistor 102c of the NOT circuit 102. One example of the transistor 103 is a P-channel MOSFET. The source of the transistor 103 is connected to the drain of the transistor 102a, and the drain of the transistor 103 is connected to the second resistor 102c. Further, the gate and back gate of the transistor 103 are connected to the drain of the transistor 103. Accordingly, the transistor 103, which is diode-connected, functions as a diode including an anode connected to the transistor 102a and a cathode connected to a node NB2 between the transistor 103 and the second resistor 102c. In the description hereafter, the transistor 103 may be referred to as "the second diode 103." The discharge resistor 104 is connected in parallel to the second diode 103. The discharge resistor 104 includes a first terminal connected to the anode of the second diode 103, and the discharge resistor 104 includes a second terminal connected to the cathode of the second diode 103. The resistance of the discharge resistor 104 differs from the resistance of the second resistor 102c. In one example, the resistance of the discharge resistor 104 is smaller than the resistance of the second resistor 102c. The resistances of the discharge resistor 104 and the second resistor 102c are variable.

The node NB2, which connects the cathode of the second diode 103 and the second resistor 102c, is connected to the second intermediate line 102d. The second intermediate line 102d is connected to the Schmitt trigger 106. Thus, the output signal of the NOT circuit 102 is output to the Schmitt trigger 106.

The Schmitt trigger 106 includes six transistors 106a to 106f. The transistors 106a and 106e are P-channel MOSFETs, and the transistors 106b to 106d and 106f are N-channel MOSFETs. The second intermediate line 102d is connected to the gates of the transistors 106a, 106b, and 106c. The source of the transistor 106a is connected to the first power line 98, the drain of the transistor 106a is connected to the drain of the transistor 106b, the source of the transistor 106b is connected to the drain of the transistor 106c, and the source of the transistor 106c is connected to the second power line 99. The back gate of the transistor 106a is connected to the source of the transistor 106a. The back gates of the transistors 106b and 106c are connected to the source of the transistor 106c. The transistor 106c is connected in parallel to the transistor 106d. The drain of the transistor 106d is connected to a node NB5, which is connected to the source of the transistor 106b and the drain of the transistor 106c. The source of the transistor 106c is connected to the second power line 99.

The drain of the transistor 106a and the drain of the transistor 106b are connected to a node NB3, which is connected to the gates of the transistors 106e and 106f. The source of the transistor 106e is connected to the first power line 98, the drain of the transistor 106e is connected to the drain of the transistor 106f, and the source of the transistor 106f is connected to the second power line 99. The back gate of the transistor 106e is connected to the source of the transistor 106e, and the back gate of the transistor 106f is connected to the source of the transistor 106f. The drain of the transistor 106e and the drain of the transistor 106f are connected to a node NB4, which is connected to the gate of the transistor 106d.

Two threshold values are set for the Schmitt trigger 97 based on the on resistance of each of the transistors 106a, 106b, 106c, and 106d. The on resistance of each of the transistors 106a, 106b, 106c, and 106d is determined by setting a suitable channel length and channel width for each of the transistors 106a, 106b, 106c, and 106d.

Action of Filter Circuit 80

The action of the first rise delay circuit 82a will now be described.

In the first rise delay circuit 82a shown in FIG. 4, when the first rise delay circuit 82a receives the input signal I at a low level (switch voltage VS level), the transistor 91a is turned on and the transistor 91b is turned off in the NOT circuit 91. Thus, the potential at the node NA1 is shifted to a high level. Since the transistor 92a is turned off and the transistor 92b is turned on in the NOT circuit 92, the potential at the node NA2 is shifted to a low level. As a result, the second rise delay signal that has a low level is input via the first intermediate line 92d to the Schmitt trigger 97. This turns on the transistor 97a and turns off each of the transistors 97b and 97c in the Schmitt trigger 97. Thus, current flows to the transistor 97a and increases the potential at the node NA4. In other words, a third rise delay signal having a high level is input to the gates of the transistors 97e and 97f. As a result, the transistor 97e is turned off, the transistor 97f is turned on, and the potential at the node NA5 is shifted to a low level. Accordingly, the output signal Y is shifted to a low level.

In the NAND circuit 96, a low-level input signal I turns on the transistor 96a of the NAND circuit 96 and turns off the transistor 96c, and a low level output signal Y turns on the transistor 96b and turns off the transistor 96d. Thus, current flows to the transistors 96a and 96b. This increases the potential at the node NA3, which is connected to the drain of the transistor 96b and the drain of the transistor 96c in the NAND circuit 96, and turns off the transistor 93. Consequently, current does not flow via the transistor 93 and the first diode 94 to the first intermediate line 92d. Accordingly, the potential at the first intermediate line 92d is maintained at a low level.

When a high-level input signal I is input to the rise delay circuit 82a, the transistor 91a is turned off and the transistor 91b is turned on in the NOT circuit 91. Thus, the potential at the node NA1 is shifted to a low level. The potential at the node NA1 turns on the transistor 92a and turns off the transistor 92b in the NOT circuit 92. The first capacitor 92e is charged through the transistor 92a, which has been turned off, and the first resistor 92c. Further, the time constant of the first resistor 92c and the first capacitor 92e increases the potential at the first intermediate line 92d. When the potential at the first intermediate line 92d exceeds the threshold voltage of the Schmitt trigger 97, the transistor 97a is turned off, the transistors 97b and 97c are turned on, and the potential at the node NA4 is shifted to a low level. The potential at the node NA4 turns on the transistor 97e and turns off the transistor 97f. Thus, current flows to the transistor 97e, and the output signal Y shifts to a high level.

In the NAND circuit 96, the high-level input signal I turns off the transistor 96a and turns on the transistor 96c. Further, the high-level output signal Y turns off the transistor 96b and turns on the transistor 96d. Since the series-connected transistors 96c and 96d are turned on, the potential at the node NA3 has a low level. Thus, the transistor 93 is turned on.

When the input signal I shifts from a low level to a high level, the current flowing through the transistor 92a and the first resistor 92c of the NOT circuit 92 charges the first capacitor 92e and increases the potential at the first intermediate line 92d in accordance with the time constant of the first resistor 92c and the first capacitor 92e. When the voltage at the first intermediate line 92d exceeds the threshold voltage of the Schmitt trigger 97, the transistor 97a is turned off and the transistors 97b and 97c are turned on. Further, the transistor 97e is turned on, and the transistor 97f is turned off. Thus, the output signal Y shifts to a high level.

When the input signal I shifts from a high level to a low level, the transistor 92b of the NOT circuit 92 discharges the first capacitor 92e to the second power line 99, and the potential at the first intermediate line 92d quickly shifts to a low level. When the potential at the first intermediate line 92d becomes less than or equal to the threshold voltage of the Schmitt trigger 97, the transistor 97a is turned on and the transistors 97b and 97c are turned off. Further, the transistor 97e is turned off and the transistor 97f is turned on. Thus, the output signal Y has a low level.

In this manner, the delay in the actions of the transistors 97a to 97c changes the time at which the output signal Y shifts from a low level to a high level relative to the time at which the input signal I shifts from a low level to a high level. In other words, the rise of the output signal Y is delayed.

The action of the first fall delay circuit 82b will now be described.

In the first fall delay circuit 82b shown in FIG. 5, when the fall delay circuit 82b receives the input signal I at a low level, the transistor 101a is turned on and the transistor 101b is turned off in the NOT circuit 101. Thus, the node NB1 is shifted to a high level. The potential at the node NB1 turns off the transistor 102a and turns on the transistor 102b in the NOT circuit 102, and the potential at the node NB2 is shifted to a low level. More specifically, the second fall delay signal that has a low level is input via the second intermediate line 102d to the Schmitt trigger 106. This turns on the transistor 106a and turns off the transistors 106b and 106c in the Schmitt trigger 106, which is connected to the second intermediate line 102d. Thus, current flows to the transistor 106a and increases the potential at the node NB3. As a result, the transistor 106e, the gate of which is connected to the node NB3, is turned off, and the transistor 106f, the gate of which is connected to the node NB3, is turned on. Thus, the output signal Y has a low level.

When a high-level input signal I is input to the fall delay circuit 82b, the transistor 101a is turned off and the transistor 101b is turned on in the NOT circuit 101. Thus, the potential at the node NB1 has a low level. The potential at the node NB1 turns on the transistor 102a and turns off the transistor 102b in the NOT circuit 102. This charges the second capacitor 102e through the transistor 102a and the second diode 103 and increases the potential at the node NB2. More specifically, the second fall delay signal that has a high level is input via the second intermediate line 102d to the Schmitt trigger 106. As a result, the transistor 106a, the gate of which is connected to the second intermediate line 102d, is turned off, and the transistors 106b and 106c, the gates of which are connected to the second intermediate line 102d, are turned on. Thus, the potential at the node NB3 has a low level. As a result, the output signal Y is shifted to a high level.

When the input signal I shifts from a low level to a high level, the potential at the second intermediate line 102d is quickly increased via the transistor 102a of the NOT circuit 102 and the second diode 103. Thus, when the voltage at the second intermediate line 102d exceeds the threshold voltage of the Schmitt trigger 106, the transistor 106a is turned off and the transistors 106b and 106c are turned on. As a result, the output signal Y shifts from a low level to a high level.

When the input signal I shifts from a high level to a low level, the transistor 102a is turned off and the transistor 102b is turned on in the NOT circuit 102. The second capacitor 102e is discharged through the transistor 102b, which has been turned on, and the second resistor 102c to the second power line 99. The potential at the second intermediate line 102d is decreased in accordance with the time constant of the second resistor 102c and the second capacitor 102e. When the voltage at the second intermediate line 102d becomes less than or equal to the threshold voltage of the Schmitt trigger 106, the transistor 106a is turned on and the transistors 106b and 106c are turned off. As a result, the output signal Y shifts from a high level to a low level.

In this manner, the delay in the actions of the transistors 106a to 106c changes the time at which the output signal Y shifts from a high level to a low level relative to the time at which the input signal I shifts from a high level to a low level. In other words, the fall of the output signal Y is delayed.

Filtering Process

Figure 6:
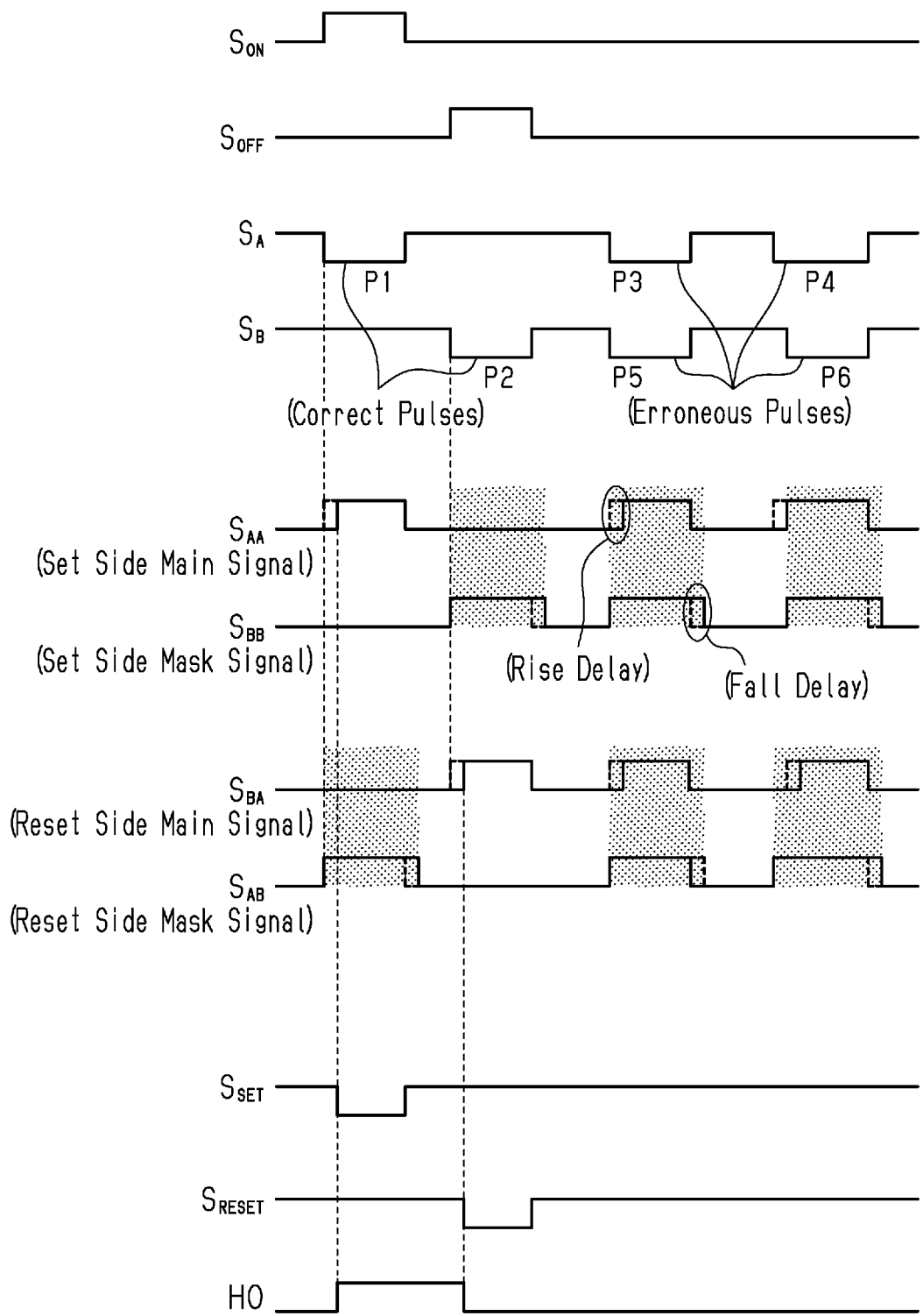
FIG. 6 is a timing chart of a filtering process.

FIG. 6 shows an example of a timing chart of signals when the filter circuit 80 performs a filtering process. FIG. 6 shows a situation in which the signal $S_A$ and the signal $S_B$ include, in correspondence with the on signal $S_{ON}$ and the off signal $S_{OFF}$, correct pulses P1 and P2 (regular pulses) but also includes erroneous pulses P3 to P6.

As shown in FIG. 6, with regard to the set side main signal $S_{AA}$ (signal obtained by performing rise delay process on signal $S_A$), pulses are cancelled during a pulse period (period shaded in FIG. 6) of the set side mask signal $S_{BB}$ (signal obtained by performing fall delay process on signal $S_B$). As a result, the set signal $S_{SET}$ does not include pulses that are generated from erroneous pulses P3 and P4. Further, with regard to the reset side main signal $S_{BA}$ (signal obtained by performing rise delay process on signal $S_B$), pulses are cancelled during a pulse period (period shaded in FIG. 6) of the reset side mask signal $S_{AB}$ (signal obtained by performing fall delay process on signal $S_A$). As a result, the reset signal $S_{RESET}$ does not include pulses generated from the erroneous pulses P5 and P6.

The filter circuit 80 performs such a filtering process and allows for avoidance of the generation of an erroneous upper output signal HO that would result from an erroneous pulse such as that described above. Further, the rise delay process is performed on the main signal (signal $S_{AA}$ and signal $S_{BA}$), and the fall delay process is performed on the mask signal (signal $S_{BB}$ and signal $S_{AB}$). Thus, even when the period of an erroneous pulse in the main signal is deviated from the pulse period of the mask signal, the erroneous pulse can be cancelled as long as the amount of deviation is within a margin (set in accordance with delay time) obtained through the delay processes. This allows the filtering process to be performed in a further proper (ensured) manner.

Generation of Erroneous Signal

As described above, the power module 1, which includes the filter circuit 80, allows for the avoidance of the generation of an erroneous signal as the upper output signal HO that would result from pulses of a shifted signal.

Several examples of generated forms of the upper output signal HO if the filter circuit 80 were not used will now be described with the timing charts of FIGS. 7 to 10. The timing charts each illustrate the lower input signal LIN, the upper input signal HIN, the boost voltage VB, the switch voltage VS, the set signal $S_{SET}$, the reset signal $S_{RESET}$, the output signal $S_Q$ of the RS flip-flop circuit 26, and the upper output signal HO.

Figure 7:
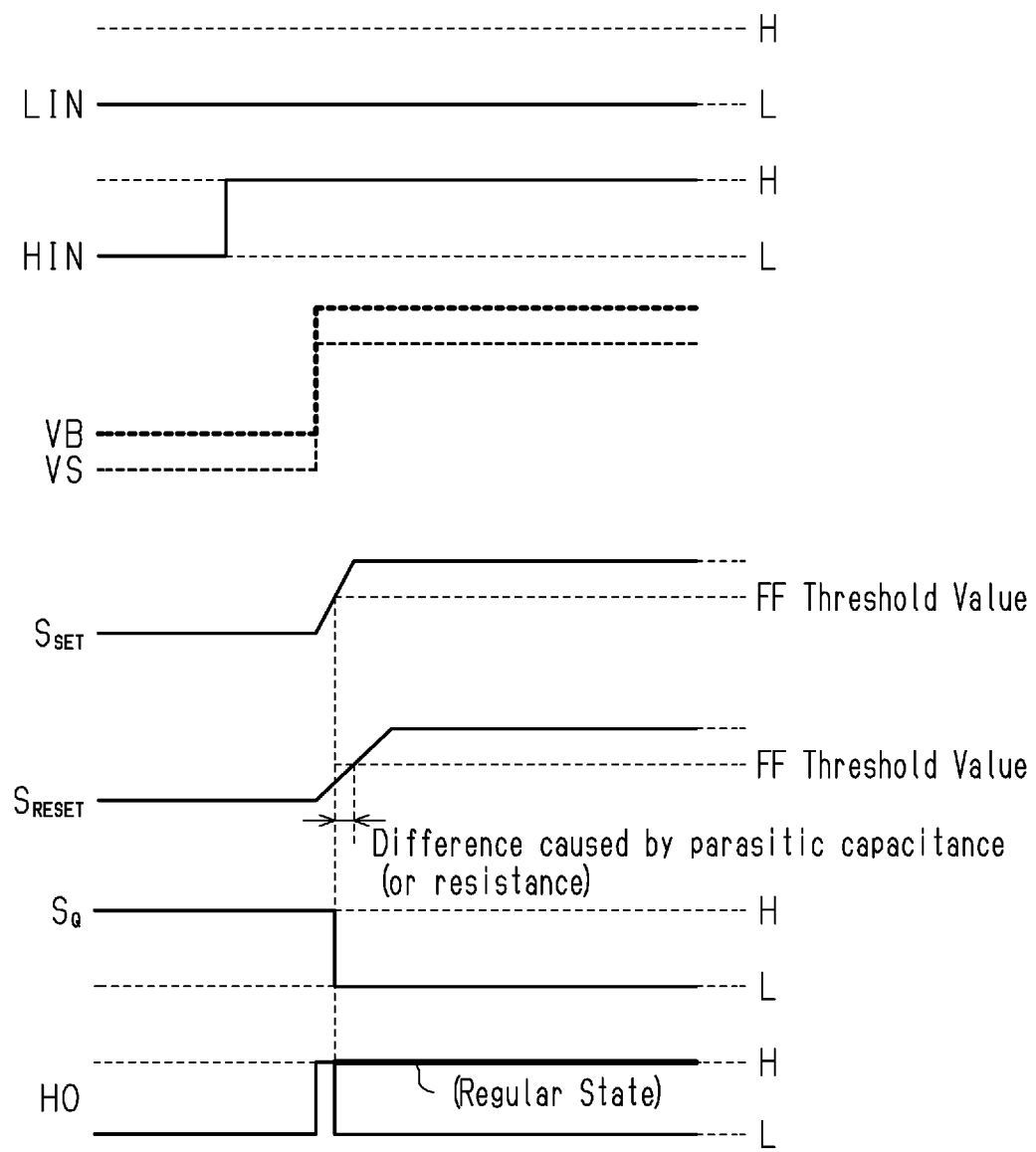
FIG. 7 is a chart illustrating the generation of an erroneous signal as an upper output signal.

FIG. 7 is a timing chart illustrating an example of when a high voltage change of dVS/dt (>0) occurs while the upper switch driving unit 20 is turned on. As shown in FIG. 7, when a change in the switch voltage VS suddenly changes the boost voltage VB, charging of the parasitic capacitances of the transistor 71 and the transistor 72 results in a rise delay of the set signal $S_{SET}$ and the reset signal $S_{RESET}$. The amount of delay differs depending on the difference in the parasitic capacitances. Further, the amount of delay may also differ depending on variations in the resistor 73 and the resistor 74.

Such a difference in the amount of delay may result in a difference between the time at which the set signal $S_{SET}$ reaches an FF threshold value (threshold value of voltage at which RS flip-flop circuit 26 recognizes signal shift) and the time at which the reset signal $S_{RESET}$ reaches the FF threshold value. As shown in FIG. 7, when the set signal $S_{SET}$ reaches the FF threshold value, the upper output signal HO, which would be maintained at a high level under a regular state as shown in FIG. 7 by the line in bold print, falls to a low level. In this manner, the upper output signal HO will be generated as an erroneous signal.

Figure 8:
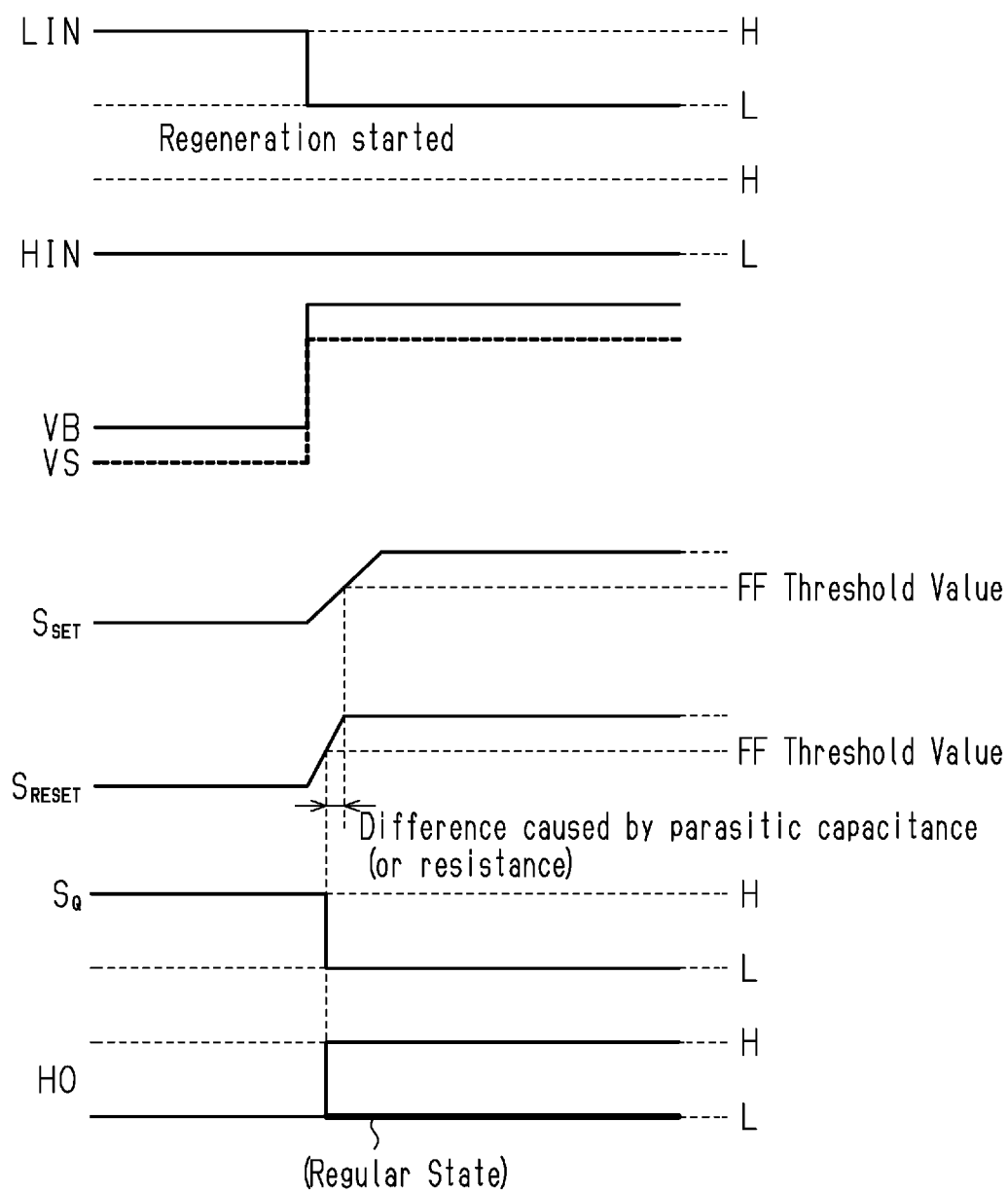
FIG. 8 is a chart illustrating the generation of an erroneous signal as an upper output signal.

FIG. 8 is a timing chart illustrating an example of when a high voltage change of dVS/dt (>0) occurs while the upper switch driving unit 20 is being regenerated. As shown in FIG. 8, when a change in the switch voltage VS suddenly changes the boost voltage VB, in the same manner as in FIG. 7, the time at which the set signal $S_{SET}$ reaches the FF threshold value differs from the time at which the reset signal $S_{RESET}$ reaches the FF threshold value.

As shown in FIG. 8, when the reset signal $S_{RESET}$ reaches the FF threshold value, the upper output signal HO, which would be maintained at a low level under a regular state as shown in FIG. 8 by the line in bolt print, shifts to a high level. In this manner, the upper output signal HO will be generated as an erroneous signal. After the upper output signal HO shifts to a high level, when the lower input signal LIN shifts to a high level, short-circuiting of the upper and lower arms may damage the power module.

Figure 9:
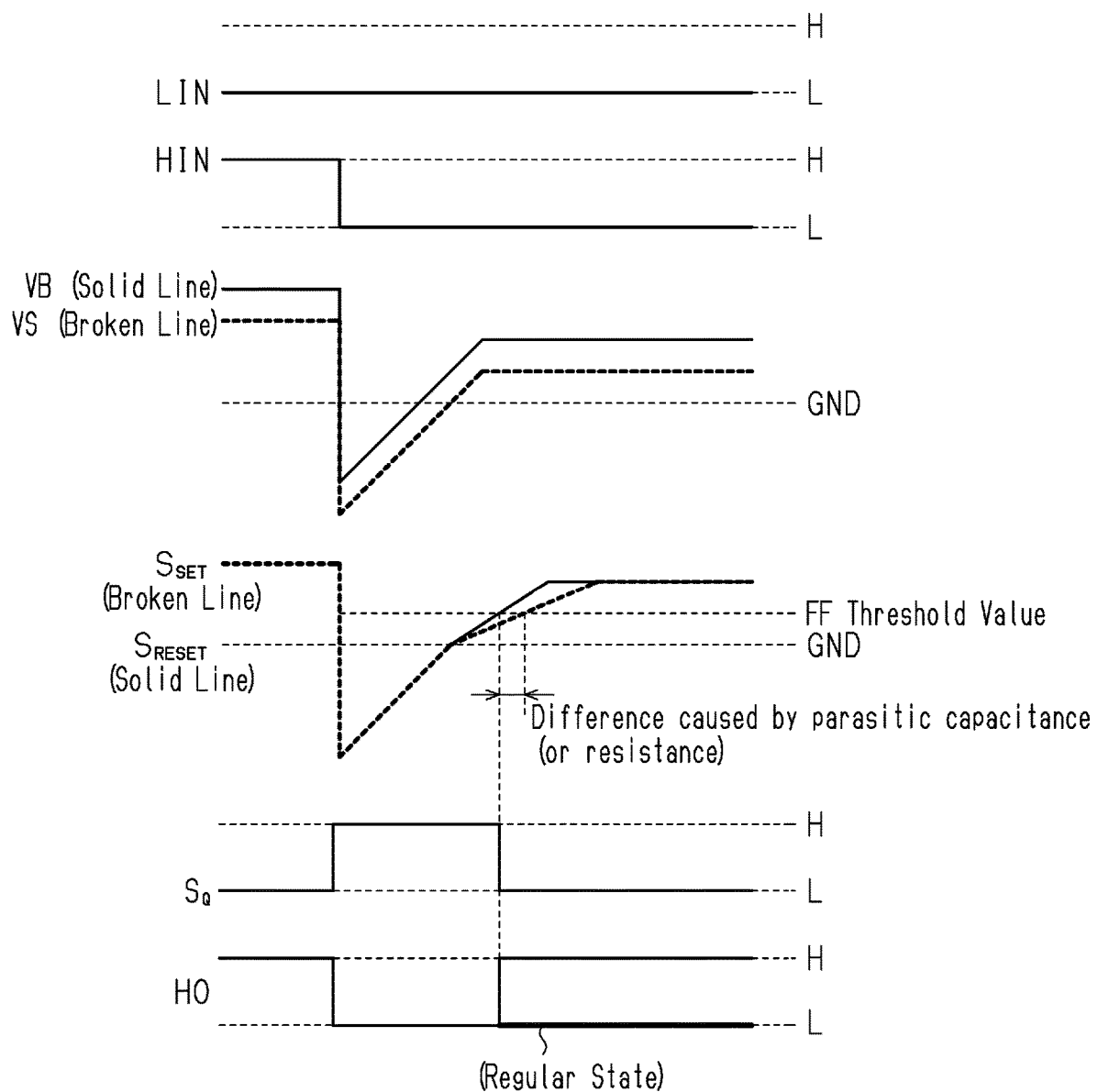
FIG. 9 is a chart illustrating the generation of an erroneous signal as an upper output signal.

FIG. 9 is a timing chart illustrating an example of when a voltage change of dVS/dt (>0) occurs (when referring to parasitic capacitance difference in particular). As shown in FIG. 9, when a change in the switch voltage VS suddenly changes the boost voltage VB resulting in an undershoot at a negative voltage, if forward bias and then reverse bias is applied to the body diodes of the transistor 71 and the transistor 72, reverse recovery current flows from the VB terminal.

In this case, the set signal $S_{SET}$ and the reset signal $S_{RESET}$ rise delayed by the charging of the parasitic capacitances of the transistor 71 and the transistor 72. The amount of delay differs depending on the difference in the parasitic capacitances. Further, the amount of delay may also differ depending on variations in the resistor 73 and the resistor 74.

Such a difference in the amount of delay results in a difference between the time at which the set signal $S_{SET}$ reaches the FF threshold value and the time at which the reset signal $S_{RESET}$ reaches the FF threshold value. As shown in FIG. 9, when the reset signal $S_{RESET}$ reaches the FF threshold value, the upper output signal HO, which would be maintained at a low level under a regular state as shown in FIG. 9 by the line in bold print, shifts to a high level. In this manner, the upper output signal HO will be generated as an erroneous signal.

Figure 10:
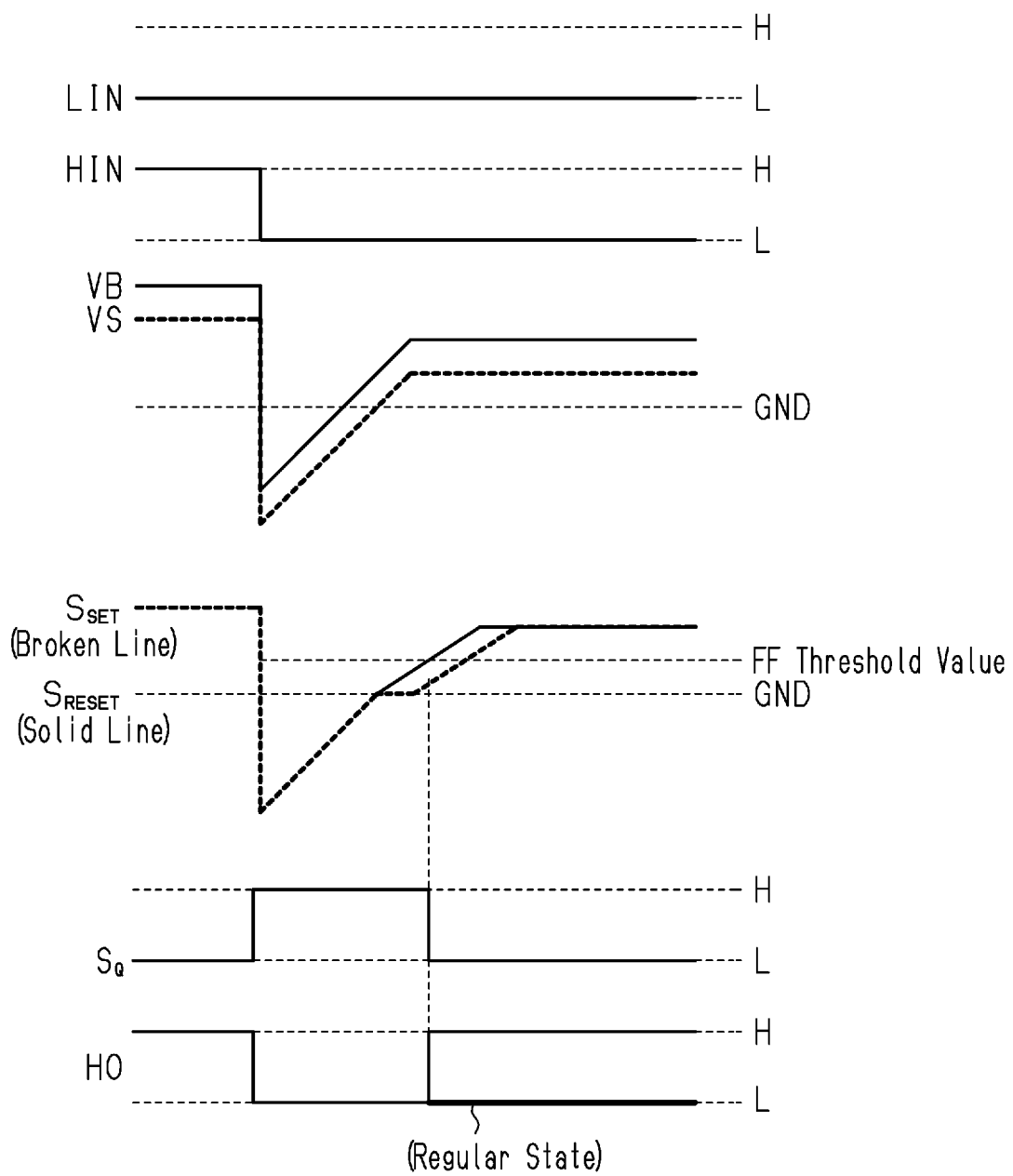
FIG. 10 is a chart illustrating the generation of an erroneous signal as an upper output signal.

FIG. 10 is a timing chart illustrating an example of when a voltage change of dVS/dt (<0) occurs (when referring to the influence of parasitic capacitances in particular). As shown in FIG. 10, when a change in the switch voltage VS suddenly changes the boost voltage VB resulting in an undershoot at a negative voltage, if forward bias and then reverse bias is applied to the body diodes of the transistor 71 and the transistor 72, reverse recovery current flows from the VB terminal.

In this case, the set signal $S_{SET}$ and the reset signal $S_{RESET}$ rise delayed by the charging of the parasitic capacitances of the transistor 71 and the transistor 72. Even if the parasitic capacitances of the two were to be the same, when reverse recovery current flows only toward the transistor 71, the influence of the parasitic capacitances would result in a rise delay. Thus, a form similar to that of FIG. 9 will result in the generation of the upper output signal HO as an erroneous signal.

In this result, the power module 1 includes the filter circuit 80. This avoids the generation of an erroneous signal as the upper output signal HO in each of the forms described above.

A sudden change in the switch voltage VS has a tendency to occur more easily when switching the arm output of the power module 1 at a higher speed. Thus, the switching speed was lowered in the prior art to reduce the generation of an erroneous signal such as that described above. However, this will increase the switching loss and decrease the efficiency of the inverter. In this respect, the power module 1 in accordance with the present embodiment includes a means for avoiding the generation of an erroneous signal. This allows for high-speed switching of the arm output and improves the efficiency of the inverter.

Operation

The operation of the present embodiment will now be described.

For example, when the lower switching element 10L is on and turned off, reverse recovery current may flow via the boot capacitor 52 to a wire 54, and the inductance of the wire 54 may generate surge voltage at the VB terminal. Surge voltage may also be generated in other cases at the VB terminal, and the surge voltage may result in the generation of the upper output signal HO as an erroneous signal.

In this aspect, the power module 1 of the present embodiment turns on the transistor 93 during a period from when the output signal Y of each of the rise delay circuits 82a and 82d shifts to a high level to when the input signal I shifts to a low level. The first diode 94 is arranged between the transistor 93 and the first intermediate line 92d, the anode of the first diode 94 is connected to the transistor 93, and the cathode of the first diode 94 is connected to the first intermediate line 92d. Thus, the voltage at the first intermediate line 92d follows the boost voltage VB and increases when the boost voltage VB increases and does not follow the boost voltage VB when the boost voltage VB decreases. This limits logic inversion of the output signal of the Schmitt trigger 97 (third rise delay signal) that would be caused by a change in the boost voltage VB.

Further, the power module 1 turns on the transistor 102a of the NOT circuit 102 while the output signal Y of each of the fall delay circuits 82b and 82c have a high level. The second diode 103 is arranged between the transistor 102a and the second intermediate line 102d, the anode of the second diode 103 is connected to the transistor 102a, and the cathode of the second diode 103 is connected to the second intermediate line 102d. Thus, the voltage at the second intermediate line 102d follows the boost voltage VB when the boost voltage VB increases and does not follow the boost voltage VB when the boost voltage VB decreases. This limits logic inversion of the output signal of the Schmitt trigger 106 (third fall delay signal) that would be caused by a change in the boost voltage VB.

Figure 11:
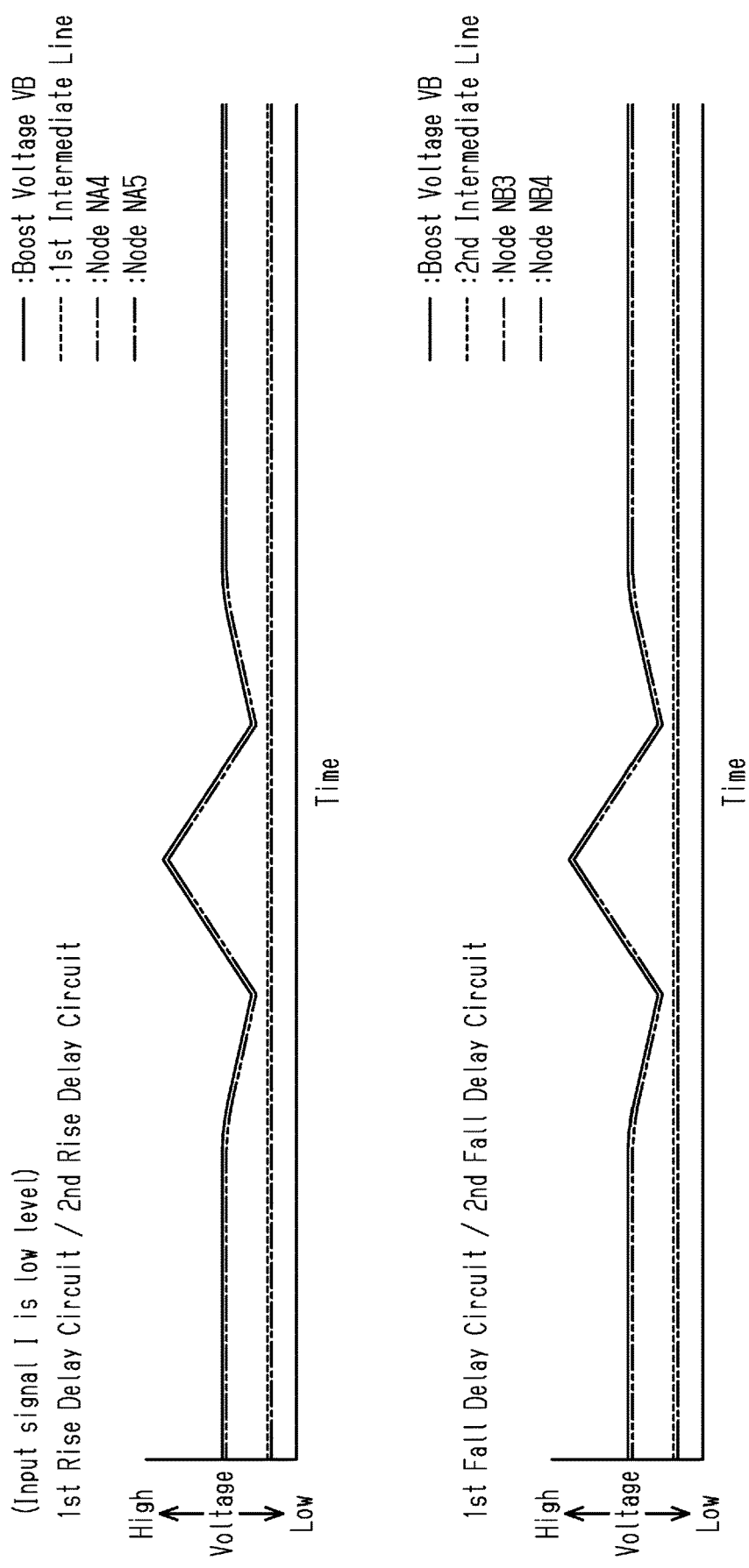
FIG. 11 is a time chart illustrating the transition of signals when a surge voltage is applied to the rise delay circuit and the fall delay circuit.

FIG. 11 shows the transition of voltage in the filter circuit 80 when the input signal I has a low level and surge voltage causes the boost voltage VB to change from a predetermined voltage so as to decrease, increase, decrease, and increase.

As illustrated above in the description of the action of the filter circuit 80, when the input signal I has a low level, in each of the rise delay circuits 82a and 82d, the first rise delay signal (node NA1) has a high level, the second rise delay signal (node NA2) has a low level, and the output signal Y has a low level. Since the transistors 96c and 96d of the NAND circuit 96 are both turned off, the potential at the node NB3 has a high level and the transistor 93 is turned off. Accordingly, current does not flow via the transistor 93 to the first intermediate line 92d. Further, the potential at the node NA2 has a low level. Thus, current does not flow via the transistor 92a to the first intermediate line 92d. As a result, the first intermediate line 92d is maintained at a low level without being affected by the boost voltage VB.

Further, in each of the fall delay circuits 82b and 82c, when the input signal I has a low level, the first fall delay signal (node NB1) has a high level, the second fall delay signal (node NB2), second intermediate line 102d) has a low level, the third fall delay signal (node NB4) has a low level, and the output signal Y has a high level. Thus, current does not flow to the second intermediate line 102d, and the second intermediate line 102d is maintained at a low level without being affected by the boost voltage VB.

Figure 12:
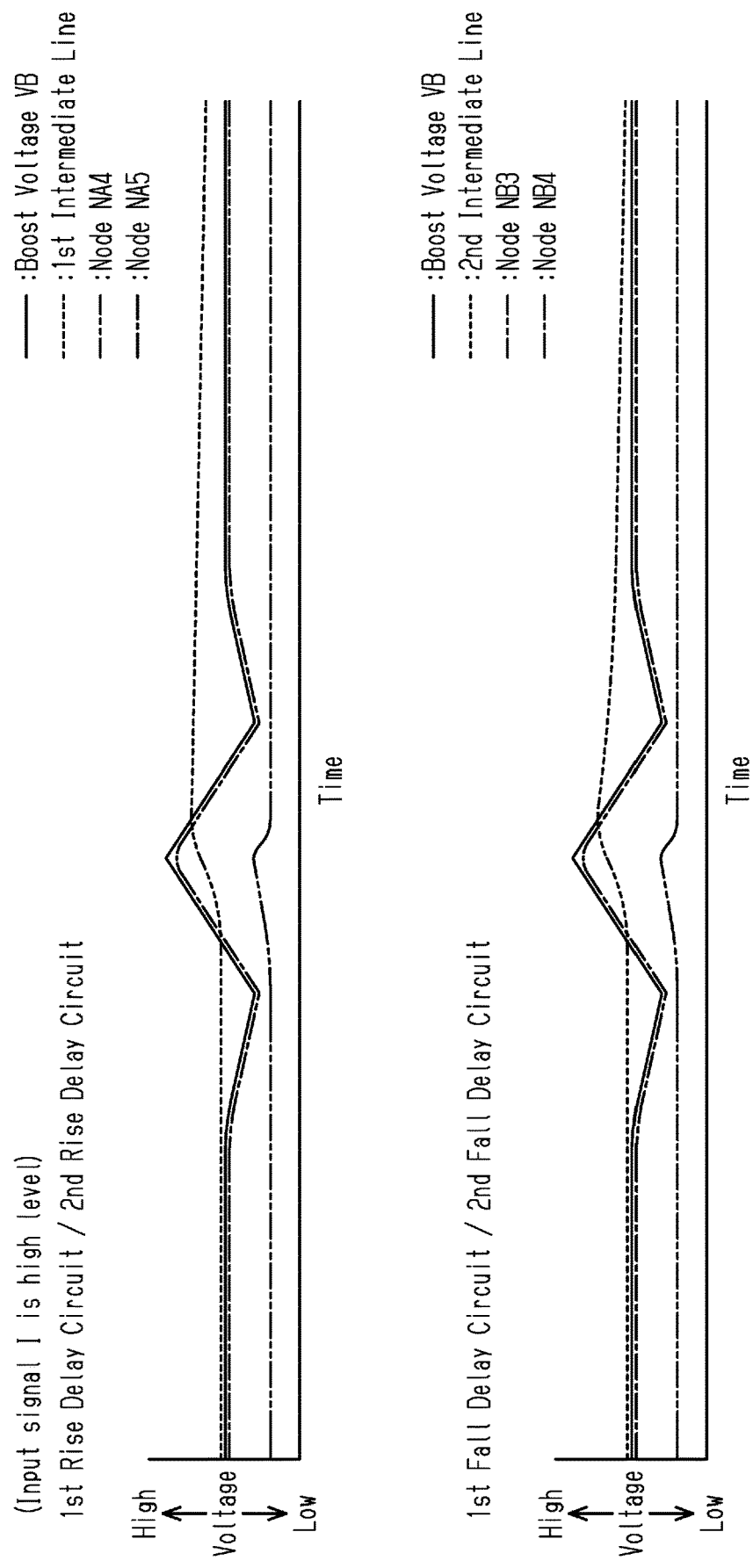
FIG. 12 is a time chart illustrating the transition of signals when a surge voltage is applied to the rise delay circuit and the fall delay circuit.

FIG. 12 shows the transition of voltage in the filter circuit 80 when the input signal I has a high level and surge voltage causes the boost voltage VB to change from a predetermined voltage so as to decrease, increase, decrease, and increase.

As illustrated above in the description of the action of the filter circuit 80, when the input signal I has a high level, in each of the rise delay circuits 82a and 82d, the first rise delay signal (node NA1) has a low level, the second rise delay signal (node NA2) has a high level, and the output signal Y has a high level. The input signal I and the output signal Y, which have a high level, turns on the transistors 96a and 96b and turns off the transistors 96c and 96d in the NAND circuit 96 and turns on the transistor 93. The first diode 94 is arranged between the transistor 93 and the first intermediate line 92d. Thus, when the boost voltage VB decreases, the first diode 94 restricts the flow of reverse current from the first intermediate line 92d to the first power line 98 and makes it difficult for the potential at the first intermediate line 92d to follow the decrease in the boost voltage VB. When the boost voltage VB increases, current flows via the transistor 93 and the first diode 94 from the first power line 98 to the first intermediate line 92d. This increases the potential at the first intermediate line 92d. In this manner, the potential at the first intermediate line 92d follows the increase in the boost voltage VB.

The action of a rise delay circuit in a comparative example will now be described and compared with the present embodiment.

The rise delay circuit of the comparative example does not include the transistor 93 and the first diode 94 of the rise delay circuits 82a and 82d of the present embodiment. In the rise delay circuit of the comparative example, when the boost voltage VB, the first capacitor 92e is discharged via the first resistor 92c and the transistor 92a to the first power line 98, the potential at the first intermediate line 92d decreases following the boost voltage VB. Then, when the boost voltage VB increases, current flows from the first power line 98 via the transistor 92a and the first resistor 92c to the first intermediate line 92d. In this case, the first capacitor 92e, which is connected to the first intermediate line 92d, delays an increase in the first intermediate line 92d from an increase in the boost voltage VB. Further, in the Schmitt trigger 97, which is supplied with the increased boost voltage VB, when the potential at the first intermediate line 92d, which is set to the input signal level, becomes less than or equal to the threshold voltage of the Schmitt trigger 97, the transistor 97a will be turned on. As a result, the output signal Y will be shifted to a low level, and logic inversion will occur.

In contrast with the rise delay circuit of the comparative example, in the rise delay circuits 82a and 82d of the present embodiment, the potential at the first intermediate line 92d does not follow a decrease in the boost voltage VB but follows an increase in the boost voltage VB. This limits erroneous functioning of the Schmitt trigger 97 and restricts logic inversion.

When a change in the boost voltage VB caused by a surge voltage ends, an increase in the boost voltage VB may result in a case where the voltage at the first intermediate line 92d increases from a predetermined voltage. In this case, the first intermediate line 92d is discharged via the first resistor 92c and the transistor 92a toward the first power line 98. This decreases the potential at the first intermediate line 92d to the level of the first power line 98, that is, the level of the boost voltage VB.

Further, in each of the fall delay circuits 82*b* and 82*c*, when the input signal I has a high level, the first fall delay signal (node NB1) has a low level, the second rise delay signal (node NB2, second intermediate line 102*d*) has a high level, the third fall delay signal (node NB4) has a low level, and the output signal Y has a low level. The second diode 103 is arranged between the transistor 102*a* and the second intermediate line 102*d*. Thus, when the boost voltage VB decreases, the second diode 103 restricts the flow of reverse current from the second intermediate line 102*d* to the first power line 98 and makes it difficult for the potential at the second intermediate line 102*d* to follow the decrease in the boost voltage VB. When the boost voltage VB increases, current flows via the second diode 103 from the first power line 98 to the second intermediate line 102*d*. This increases the potential at the second intermediate line 102*d*. In this manner, the potential at the second intermediate line 102*d* follows the increase in the boost voltage VB The action of a fall delay circuit in a comparative example will now be described and compared with the present embodiment.

The fall delay circuit of the comparative example does not include the second diode 103 of the fall delay circuits 82*b* and 82*c* of the present embodiment. In the fall delay circuit of the comparative example, in the same manner as the rise delay circuits 82*a* and 82*d*, the potential at the second intermediate line 102*d* causes erroneous functioning of the Schmitt trigger 106 and logic inversion of the output signal Y. In contrast with the fall delay circuit of the comparative example, in the fall delay circuits 82*b* and 82*c* of the present embodiment, the potential at the second intermediate line 102*d* does not follow a decrease in the boost voltage VB but follows an increase in the boost voltage VB. This limits erroneous functioning of the Schmitt trigger 106 and restricts logic inversion.

When a change in the boost voltage VB caused by a surge voltage ends, an increase in the boost voltage VB may result in a case where the voltage at the second intermediate line 102*d* increases from a predetermined voltage. In this case, the second intermediate line 102*d* is discharged via the discharge resistor 104 and the transistor 102*a* toward the first power line 98. This decreases the potential at the second intermediate line 102*d* to the level of the first power line 98, that is, the level of the boost voltage VB.

In this manner, even if the boost voltage VB changes, the change in the boost voltage VB will not result in each of the rise delay circuits 82*a* and 82*d* and each of the fall delay circuits 82*b* and 82*c* causing a signal logic inversion in the Schmitt triggers 97 and 106. This limits the generation of an erroneous signal as the upper output signal HO.

The present embodiment has the advantages described below.

(1) The transistor 93 and the first diode 94 are arranged between the first power line 98 and the first intermediate line 92*d* of the NOT circuit 92 of each of the rise delay circuits 82*a* and 82*d*. When the transistor 93 is turned on and a high-level input signal I is input to each of the rise delay circuits 82*a* and 82*d*, the potential at the first intermediate line 92*d* will not follow a change in the boost voltage VB toward the decreasing side, and the potential at the first intermediate line 92*d* will follow a change in the boost voltage VB toward the increasing side. This restricts signal logic inversion in the Schmitt trigger 97 and restricts logic inversion of the output signal Y. Further, the second diode 103 is arranged between the transistor 102*a* and the second intermediate line 102*d* of the NOT circuit 102 of each of the fall delay circuits 82*b* and 82*c*. Thus, when a high-level input signal I is input to each of the fall delay circuits 82*b* and 82*c*, the potential at the second intermediate line 102*d* will not follow a change in the boost voltage VB toward the decreasing side, and the potential at the second intermediate line 102*d* will follow a change in the boost voltage VB toward the increasing side. This restricts signal logic inversion in the Schmitt trigger 106 and restricts logic inversion of the output signal Y. In this manner, logic inversion of the output signal Y is restricted in of each of the rise delay circuits 82*a* and 82*d* and the fall delay circuits 82*c* and 82*d*. This limits the generation of an erroneous signal as the upper output signal HO that would be caused by a change in the boost voltage VB.

(2) Each of the rise delay circuits 82*a* and 82*d* includes the NOT circuit 92 that receives the first rise delay signal of the NOT circuit 91. Thus, when a low-level input signal I is input, current does not flow from the first power line 98 to the first intermediate line 92*d*. As a result, the first intermediate line 92*d* is not affected by the boost voltage VB. This limits the generation of an erroneous signal as the upper output signal HO that would be caused by a change in the boost voltage VB. Further, each of the fall delay circuits 82*b* and 82*c* includes the NOT circuit 102 that receives the first fall delay signal of the NOT circuit 101. Thus, when a low-level input signal I is received, current does not flow from the first power line 98 to the second intermediate line 102*d*. Thus, the second intermediate line 102*d* is not affected by the boost voltage VB. This limits the generation of an erroneous signal as the upper output signal HO that would be caused by a change in the boost voltage VB.

(3) The discharge resistor 104 and the second diode 103 are arranged in parallel in each of the fall delay circuits 82*b* and 82*c*. Thus, after the potential at the second intermediate line 102*d* follows a change in the boost voltage VB toward the increasing side, discharging is performed via the discharge resistor 104. This lowers the potential at the second intermediate line 102*d*.

Application Examples of Power Module 1

Figure 13:
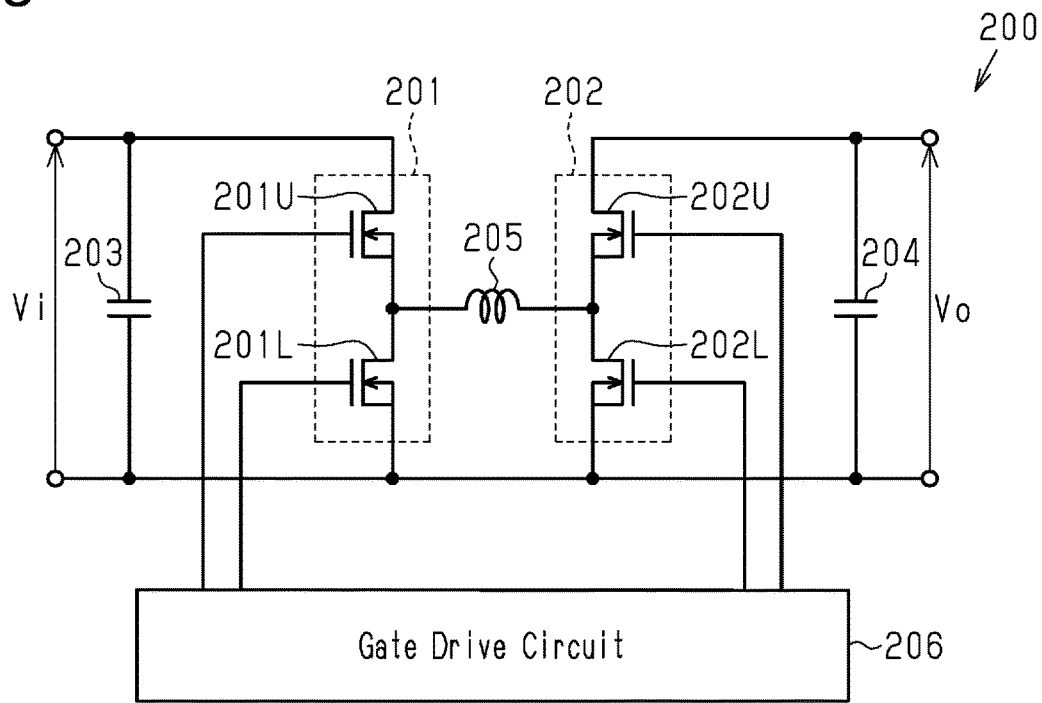
FIG. 13 is a diagram illustrating an example of a power module application.
Figure 14:
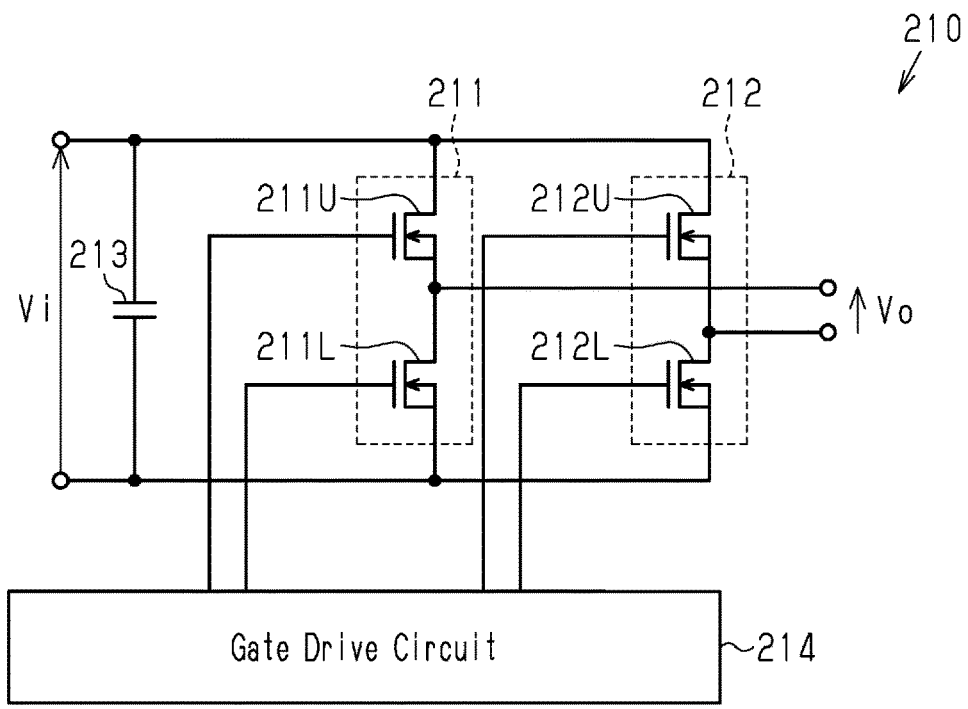
FIG. 14 is a diagram illustrating an example of a power module application.
Figure 15:
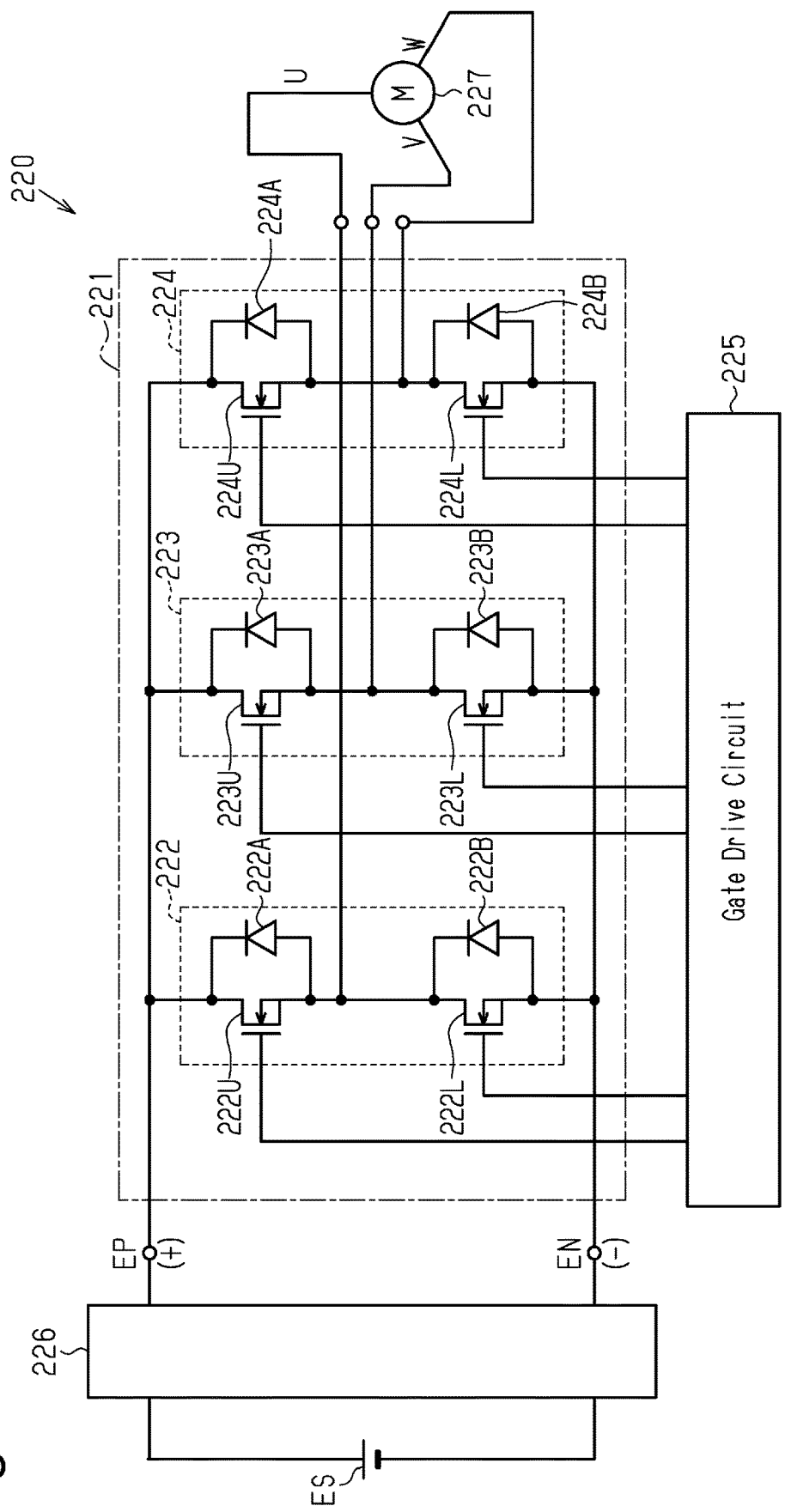
FIG. 15 is a diagram illustrating an example of a power module application.

With reference to FIGS. 13 to 15, examples of circuits to which the power module 1 is applied will now be described.

The power module 1 is applicable to an H-bridge converter. FIG. 13 shows the circuit configuration of an H-bridge step-down converter (hereafter simply referred to as "the converter circuit 200") as one example of an H-bridge converter.

The converter circuit 200 increases an input voltage VI to an output voltage Vo and includes a first inverter unit 201, a second inverter unit 202, an input capacitor 203, an output capacitor 204, an inductance 205, and a gate drive circuit 206.

The first inverter unit 201 includes an upper switching element 201U and a lower switching element 201L. The source terminal of the upper switching element 201U is electrically connected to the drain terminal of the lower switching element 201L. The first inverter unit 201 is connected in parallel to the input capacitor 203. In detail, the drain terminal of the upper switching element 201U is electrically connected to a first terminal of the input capacitor 203, and the source terminal of the lower switching element 201L is connected to a second terminal of the input capacitor 203.

The second inverter unit 202 includes an upper switching element 202U and a lower switching element 202L. The source terminal of the upper switching element 202U is electrically connected to the drain terminal of the lower switching element 202L. The second inverter unit 202 is connected in parallel to the output capacitor 204. In detail, the drain terminal of the upper switching element 202U is electrically connected to a first terminal of the output capacitor 204, and the source terminal of the lower switching element 202L is electrically connected to a second terminal of the output capacitor 204.

The inductance 205 is connected to the first inverter unit 201 and the second inverter unit 202. In detail, a first terminal of the inductance 205 is connected to a connection point in the first inverter unit 201 between the source terminal of the upper switching element 201U and the drain terminal of the lower switching element 201L. A second terminal of the inductance 205 is connected to a connection point in the second inverter unit 202 between the source terminal of the upper switching element 202U and the drain terminal of the lower switching element 202L.

The gate drive circuit 206 is electrically connected to the gate terminal of each of the switching elements 201U, 201L, 202U, and 202L. The gate drive circuit 206 on-off controls each of the switching elements 201U, 201L, 202U, and 202L.

The power module 1 is applicable to the full-bridge inverter circuit shown in FIG. 14 (hereafter simply referred to as "the inverter circuit 210"). The inverter circuit 210 includes a first inverter unit 211, a second inverter unit 212, an input capacitor 213, and a gate drive circuit 214 and converts the input voltage VI to the output voltage Vo with the first inverter unit 211 and the second inverter unit 212.

The first inverter unit 211 includes an upper switching element 211U and a lower switching element 211L. The source terminal of the upper switching element 211U is electrically connected to the drain terminal of the lower switching element 211L. The first inverter unit 211 is connected in parallel to the input capacitor 213. In detail, the drain terminal of the upper switching element 211U is electrically connected to a first terminal of the input capacitor 213, and the source terminal of the lower switching element 211L is electrically connected to a second terminal of the input capacitor 213.

The second inverter unit 212 includes an upper switching element 212U and a lower switching element 212L. The source terminal of the upper switching element 212U is electrically connected to the drain terminal of the lower switching element 212L. The second inverter unit 212 is connected in parallel to the first inverter unit 211. In detail, the drain terminal of the upper switching element 212U is electrically connected to the drain terminal of the upper switching element 211U, and the source terminal of the lower switching element 212L is electrically connected to the source terminal of the lower switching element 211L. The output voltage Vo is set by the voltage obtained between the connection point of the source terminal of the upper switching element 211U and the drain terminal of the lower switching element 211L and the connection point of the source terminal of the upper switching element 212U and the drain terminal of the lower switching element 212L.

The gate drive circuit 214 is electrically connected to the gate terminal of each of the switching elements 211U, 211L, 212U and 212L. The gate drive circuit 214 on-off controls each of the switching elements 211U, 211L, 212U and 212L.

The power module 1 is applicable to the three-phase AC inverter circuit shown in FIG. 15 (hereafter simply referred to as "the three-phase inverter circuit 220").

The three-phase inverter circuit 220 includes a power drive unit 221 electrically connected to the U-phase, V-phase, and W-phase coils of a three-phase AC motor (hereafter simply referred to as "the motor 227"), a gate drive circuit 225 that controls the power drive unit 221, and a converter unit 226 connected to a power drive unit 221 and a power supply ES. The converter unit 226 includes a positive power terminal EP and a negative power terminal EN.

The power drive unit 221 controls the power supplied to the U-phase, V-phase, and W-phase coils of the motor 227. The power drive unit 221 includes a U-phase inverter unit 222, a V-phase inverter unit 223, and a W-phase inverter unit 224. The U-phase inverter unit 222, the V-phase inverter unit 223, and the W-phase inverter unit 224 are connected in parallel to one another between the positive power terminal EP and the negative power terminal EN.

The U-phase inverter unit 222 includes an upper switching element 222U and a lower switching element 222L. The drain terminal of the upper switching element 222U is electrically connected to the positive power terminal EP. The source terminal of the upper switching element 222U is electrically connected to the drain terminal of the lower switching element 222L. The source terminal of the lower switching element 222L is connected to the negative power terminal EN. The upper switching element 222U is connected in inverse-parallel to a snubber diode 222A, and the lower switching element 222L is connected in inverse-parallel to a snubber diode 222B. In detail, the anode of the snubber diode 222A is electrically connected to the source terminal of the upper switching element 222U, and the cathode of the snubber diode 222A is electrically connected to the drain terminal of the upper switching element 222U. The anode of the snubber diode 222B is electrically connected to the source terminal of the lower switching element 222L, and the cathode of the snubber diode 222B is electrically connected to the drain terminal of the lower switching element 222L.

The V-phase inverter unit 223 includes an upper switching element 223U and a lower switching element 223L. The drain terminal of the upper switching element 223U is electrically connected to the positive power terminal EP. The source terminal of the upper switching element 223U is electrically connected to the drain terminal of the lower switching element 223L. The source terminal of the lower switching element 223L is connected to the negative power terminal EN. The upper switching element 223U is connected in inverse-parallel to a snubber diode 223A, and the lower switching element 223L is connected in inverse-parallel to a snubber diode 223B. In detail, the anode of the snubber diode 223A is electrically connected to the source terminal of the upper switching element 223U, and the cathode of the snubber diode 223A is electrically connected to the drain terminal of the upper switching element 223U. The anode of the snubber diode 223B is electrically connected to the source terminal of the lower switching element 223L, and the cathode of the snubber diode 223B is electrically connected to the drain terminal of the lower switching element 223L.

The W-phase inverter unit 224 includes an upper switching element 224U and a lower switching element 224L. The drain terminal of the upper switching element 224U is electrically connected to the positive power terminal EP. The source terminal of the upper switching element 224U is electrically connected to the drain terminal of the lower switching element 224L. The source terminal of the lower switching element 224L is connected to the negative power terminal EN. The upper switching element 224U is connected in inverse-parallel to a snubber diode 224A, and the lower switching element 224L is connected in inverse-parallel to a snubber diode 224B. In detail, the anode of the snubber diode 224A is electrically connected to the source terminal of the upper switching element 224U, and the cathode of the snubber diode 224A is electrically connected to the drain terminal of the upper switching element 224U. The anode of the snubber diode 224B is electrically connected to the source terminal of the lower switching element 224L, and the cathode of the snubber diode 224B is electrically connected to the drain terminal of the lower switching element 224L.

The gate drive circuit 225 is electrically connected to the gate terminal of each of the switching elements 222U, 222L, 223U, 223L, 224U, and 224L. The gate drive circuit 225 on-off controls each of the switching elements 222U, 222L, 223U, 223L, 224U, and 224L.

Modified Examples

The description related with the above embodiment exemplifies, without any intention to limit, applicable forms of a power module according to the present invention. The power module according to the present invention is applicable to, for example, modified examples of the above embodiment that are described below and combinations of at least two of the modified examples that do not contradict each other.

Figure 16:
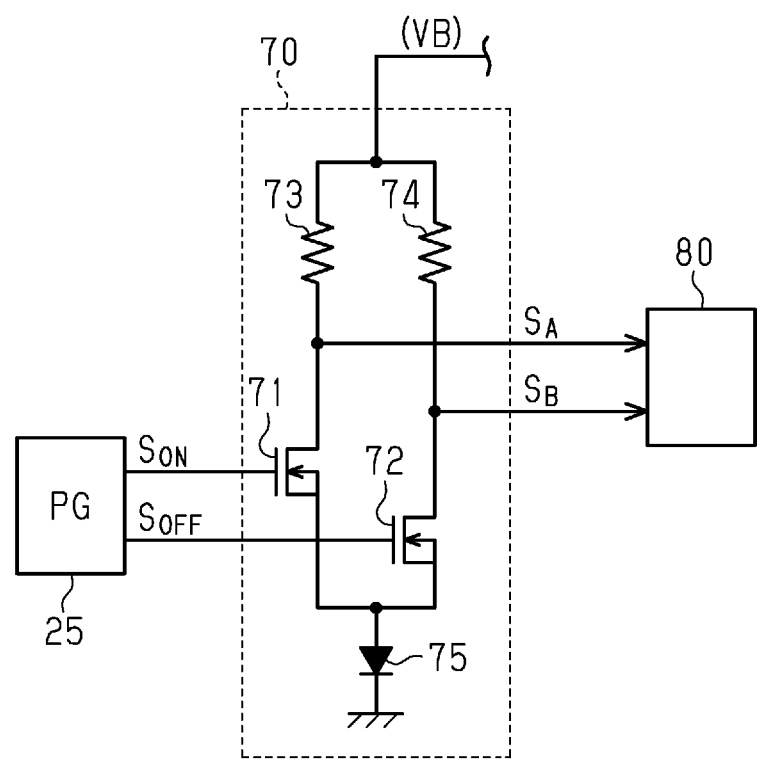
FIG. 16 is a diagram of a modified example of a level shifter.

In the above embodiment, the configuration of the level shifter 70 may be changed in any manner. In one example, as shown in FIG. 16, the level shifter 70 includes a reverse current protection diode 75. The reverse current protection diode 75 has an anode connected to the source and back gate of each of the transistors 71 and 72 and a cathode connected to the ground terminal GND. This configuration includes the reverse current protection diode 75 and avoids the generation of an erroneous signal as the upper output signal HO that would result from a reverse recovery current at the level shifter 70.

In the above embodiment, the switch that starts and stops the supply of current from the first power line 98 to the first intermediate line 92d may be a switch formed by a configuration other than the transistor 93.

In the above embodiment, the first diode 94 and the second diode 103 may each be a diode that is not a diode-connected MOS.

In the above embodiment, the first capacitor 92e and the second capacitor 102e may each be a capacitor that is not a MOS capacitor.

In the above embodiment, a NOT circuit may be added to each of the fall delay circuits 82b and 82c. In this case, the NOT circuits 84a and 84b between the fall delay circuits 82b and 82c and the RS flip-flop circuit 26 is omitted from the filter circuit 80.

In the converter circuit 200 shown in FIG. 13, the gate drive circuit 206 may include an upper gate drive circuit and a lower gate drive circuit. The upper gate drive circuit on-off controls the upper switching element 201U of the first inverter unit 201 and the upper switching element 202U of the second inverter unit 202. The lower gate drive circuit on-off controls the lower switching element 201L of the first inverter unit 201 and the lower switching element 202L of the second inverter unit 202. The upper gate drive circuit and the lower gate drive circuit may each be formed by a single chip.

In the inverter circuit 210 shown in FIG. 14, the gate drive circuit 214 may include an upper gate drive circuit and a lower gate drive circuit. The upper gate drive circuit on-off controls the upper switching element 211U of the first inverter unit 211 and the upper switching element 212U of the second inverter unit 212. The lower gate drive circuit on-off controls the lower switching element 211L of the first inverter unit 211 and the lower switching element 212L of the second inverter unit 212. The upper gate drive circuit and the lower gate drive circuit may each be formed by a single chip.

In the three-phase inverter circuit 220 shown in FIG. 15, the gate drive circuit 214 may include an upper gate drive circuit and a lower gate drive circuit. The upper gate drive circuit on-off controls the upper switching element 222U of the U-phase inverter unit 222, the upper switching element 223U of the V-phase inverter unit 223, and the upper switching element 224U of the W-phase inverter unit 224. The lower gate drive circuit on-off controls the lower switching element 222L of the U-phase inverter unit 222, the lower switching element 223L of the V-phase inverter unit 223, and the lower switching element 224L of the W-phase inverter unit 224. The upper gate drive circuit and the lower gate drive circuit may each be formed by a single chip.

DESCRIPTION OF THE REFERENCE CHARACTERS 1) power module, 2) switch driving device, 10U) upper switching element (switching element), 20) upper switch driving unit (switch driving device), 27) driver, 26) RS flip-flop circuit, 70) level shifter (signal transmission circuit), 80) filter circuit (signal transmission circuit), 82a) first rise delay circuit, 82b) first fall delay circuit, 82c) second fall delay circuit, 82d) second rise delay circuit, 83a) NAND circuit (first logic circuit), 83b) NAND circuit (second logic circuit), 91) NOT circuit (first rise delay NOT circuit), 92) NOT circuit (second rise delay NOT circuit), 92d) first intermediate line, 92c) first resistor, 92e) first capacitor, 93) transistor (switch), 94) first diode, 96) NAND circuit, 97) Schmitt trigger (first Schmitt trigger), 98) first power line, 99) second power line, 101) NOT circuit (first fall delay NOT circuit), 102) NOT circuit (second fall delay NOT circuit), 102a) transistor (switch), 102c) second resistor, 102d) second intermediate line, 102e) second capacitor, 103) second diode, 104) discharge resistor, 106) Schmitt trigger (second Schmitt trigger)

The invention claimed is:
1. A signal transmission circuit comprising:
a level shifter that is actuated with a first voltage and a second voltage, which is lower than the first voltage, and level-shifts each of a first input signal and a second input signal to output a first shifted signal and a second shifted signal; and
a filter circuit that is actuated with the first voltage and the second voltage and performs a filtering process on each of the first shifted signal and the second shifted signal, wherein
the filter circuit includes
a first rise delay circuit that delays a rising time of the first shifted signal by a predetermined time for output,
a first fall delay circuit that delays a falling time of the second shifted signal by a predetermined time for output, and
a first power line that applies the first voltage to each of the first rise delay circuit and the first fall delay circuit, wherein
the first rise delay circuit includes a first rise delay NOT circuit that inverts the first shifted signal for output and a second rise delay NOT circuit that inverts a first rise delay signal of the first rise delay NOT circuit, the first fall delay circuit includes a first fall delay NOT circuit that inverts the second shifted signal for output and a second fall delay NOT circuit that inverts a first fall delay signal of the first fall delay NOT circuit for output, the first rise delay circuit is configured so that a second rise delay signal of the second rise delay NOT circuit does not follow a change in the first voltage toward a decreasing side and follows a change in the first voltage toward an increasing side, the first fall delay circuit is configured so that a second fall delay signal of the second fall delay NOT circuit does not follow a change in the first voltage toward a decreasing side and follows a change in the first voltage toward an increasing side, the first rise delay circuit includes a first intermediate line to which the second rise delay signal is applied, a first resistor arranged between the first power line and the first intermediate line, a first capacitor connected between a second power line, which is supplied with the second voltage, and the first intermediate line, a first diode arranged between the first intermediate line and the first power line, and a switch that starts and stops supply of current to the first diode, and the first rise delay circuit includes a NAND circuit that actuates the switch based on the first shifted signal and an output signal of the first rise delay circuit.

2. The signal transmission circuit according to claim 1, wherein the first diode is a MOS diode.

3. The signal transmission circuit according to claim 1, wherein the first rise delay circuit includes a first Schmitt trigger that receives the second rise delay signal.

4. The signal transmission circuit according to claim 1, wherein:

the filter circuit includes a first power line that applies the first voltage to each of the first rise delay circuit and the first fall delay circuit; and the first fall delay circuit includes a second intermediate line to which the second fall delay signal is applied, a second capacitor connected between a second power line, which is supplied with the second voltage, and the second intermediate line, a second resistor arranged between the second intermediate line and the second power line, and a second diode arranged between the second intermediate line and the first power line.

5. The signal transmission circuit according to claim 4, wherein the second diode is a MOS diode.

6. The signal transmission circuit according to claim 4, wherein the first fall delay circuit includes a discharge resistor connected in parallel to the second diode.

7. The signal transmission circuit according to claim 1, wherein the first fall delay circuit includes a second Schmitt trigger that receives the second fall delay signal.

8. The signal transmission circuit according to claim 1, wherein the filter circuit serving as a circuit that performs the filtering process on the second shifted signal includes a second rise delay circuit that delays a rising time of the second shifted signal by a predetermined time for output, and a second fall delay circuit that delays a falling time of the first shifted signal by a predetermined time for output, the second rise delay circuit is identical in configuration to the first rise delay circuit, and the second fall delay circuit is identical in configuration to the first fall delay circuit.

9. The signal transmission circuit according to claim 8, wherein the filter circuit includes a first logic circuit that generates a set signal based on an output signal of the first rise delay circuit and an output signal of the first fall delay circuit, a second logic circuit that generates a reset signal based on an output signal of the second rise delay circuit and an output signal of the second fall delay circuit, and an RS flip-flop circuit that receives the set signal and the reset signal.

10. A switch driving device comprising:

the signal transmission circuit according to claim 9; and a driver that generates an output signal corresponding to an output of the RS flip-flop circuit and provides the output signal to a switching element.

11. A power module comprising:

the switch driving device according to claim 10; and the switching element.

* * * * *